(12) United States Patent
Fayyaz

(10) Patent No.: US 6,906,601 B2
(45) Date of Patent: Jun. 14, 2005

(54) VARIABLE PHASE SHIFTER AND A SYSTEM USING VARIABLE PHASE SHIFTER

(75) Inventor: Nader Fayyaz, Ottawa (CA)

(73) Assignee: RF Tune Inc., Waterloo (CA)

( * ) Notice: Subject to any disclaimer, the term of this patent is extended or adjusted under 35 U.S.C. 154(b) by 0 days.

(21) Appl. No.: 10/454,640

(22) Filed: Jun. 5, 2003

(65) Prior Publication Data
US 2003/0227353 A1 Dec. 11, 2003

(51) Int. Cl.[7] ............................................. H01P 1/18
(52) U.S. Cl. ..................................... 333/156; 333/157
(58) Field of Search ............................... 333/156, 126; 330/251, 256, 107

(56) References Cited

U.S. PATENT DOCUMENTS 6,122,488 A * 9/2000 Leizerovich et al. .......... 455/78

* cited by examiner

Primary Examiner—Peguy Jeanpierre
Assistant Examiner—Joseph Lauture

(57) ABSTRACT

A variable phase shifter and a system for the variable phase shifter are provided. The phase shifter includes fixed phase shift elements, active devices for amplifying the outputs of the fixed phase shift elements, a combiner for combining the outputs of the active devices. For controlling the phase of the output signal, a bias controller is provided. The bias controller controls the bias of amplification in the fixed phase shift elements. The active devices may be FET or Bipolar Transistors, and are inductively connected to the ground. The phase shifter can be integrated into a system on chip with a smart antenna front-end system.

19 Claims, 28 Drawing Sheets

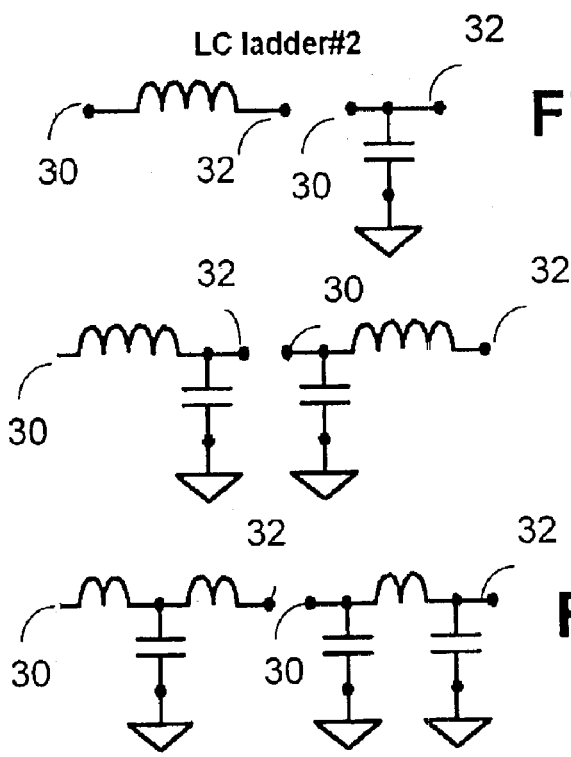

VARIABLE PHASE SHIFTER AND A SYSTEM USING VARIABLE PHASE SHIFTER

FIELD OF THE INVENTION

This invention relates to a signal processing technology, more particularly to a variable phase shifter and a system using the variable phase shifter.

BACKGROUND OF THE INVENTION

Over the last decade, wireless communication services have been expanded. To provide such services, components of communication equipments have been complicated and large. It is therefore demanded to provide small size wireless communication equipments. In current smart antenna systems, a phase shifter is one of the main components, and is one of the limiting factors for reducing the size and required cost of the smart antenna systems.

The current phase shifters are categorized into a DSP phase shifter and a passive phase shifter. The DSP phase shifter converts received digital signals into digital form and performs phase shifting and power combining. The Power consumption in this approach is, however, high, and it requires off-chip components and silicon area. The passive phase shifters are expensive and cannot be integrated in a single chip.

Ellinger et al. discloses an adaptive antenna receiver in "An Antenna Diversity MMIC Vector Modulator for HIP-ERLAN with Low Power Consumption and Calibration Capability (IEEE Transactions on Microwave theory and techniques, Vol. 49, No. 5, May 2001)". FIG. 1 shows the vector modular 200 of Ellinger et al. The vector modular 200 includes three paths 201, 202 and 203. For each path, a preamplifier is provided. In the paths 201–203, a lowpass filter 204, a capacitor 205 and a highpass filter 206 are provided. The gate nodes of three transistors E50 are connected to the lowpass filter 204, the capacitor 205 and the highpass filter 206, respectively. An input signal is applied to the preamplifiers, then to the paths 201–203 and is transmitted to the transistors E50. The vector modulator 200 achieves 360° phase shift.

However, the vector modulator 200 uses multiple pre-amplifiers and multiple inductors. That may result in higher noise and no-linearity of phase shifting, and then result in high cost if it is implemented in silicon. Further, matching circuit is not used between the two amplifiers. That may result in loss, higher noise and higher power consumption.

Therefore, it is desirable to provide a new phase shifter, which can meet demands for a small size and low cost, and can be integrated in a single chip with applications.

SUMMARY OF THE INVENTION

It is an object of the invention to provide a novel phase shifter and a system that obviates or mitigates at least one of the disadvantages of existing systems.

In accordance with an aspect of the present invention, there is provided a variable phase shifter that has an input node for receiving an input signal, a first path and a second path for performing analog signal processing, an output node for combining the outputs of the first path and the second path to provide an output signal, and a bias controller for generating first and second bias signals in response to a phase control signal for controlling amplification of first and second active devices. The first path includes a first fixed phase shift element for shifting the phase of the input signal by a first shift value, and the first active device for amplifying the output of the first phase shift element. The first active device is inductively coupled to a ground via a first element of the first fixed phase shift element. The second path includes a second fixed phase shift element for shifting the phase of the input signal by a second shift value, and the second active device for amplifying the output of the second phase shift element. The second active device is inductively coupled to a ground via a second element of the second fixed phase shift element.

In accordance with a further aspect of the present invention, there is provided a smart antenna front end system that has a receiver for receiving an RF receiving signal from an antenna, including first and second variable phase shifter, and a transmitter for transmitting an RF transmitting signal from the antenna, including third and forth variable phase shifter. Each of the first, second, third and forth variable phase shifter includes an input node for receiving an input signal, a first path and a second path for performing analog signal processing, an output node for combining the outputs of the first path and the second path to provide an output signal, and a bias controller for generating first and second bias signals in response to a phase control signal for controlling amplification of first and second active devices. The first path includes a first fixed phase shift element for shifting the phase of the input signal by a first shift value, and the first active device for amplifying the output of the first phase shift element. The first active device is inductively coupled to a ground via a first element of the first fixed phase shift element. The second path includes a second fixed phase shift element for shifting the phase of the input signal by a second shift value, and the second active device for amplifying the output of the second phase shift element. The second active device is inductively coupled to a ground via a second element of the second fixed phase shift element.

In accordance with a further aspect of the present invention, there is provided a smart antenna front end system that has a local oscillator path including an local oscillator, and first and second variable phase shifter for shifting the phase of an input signal output from the local oscillator, a receiver for receiving an RF receiving signal from an antenna, and a transmitter for transmitting an RF transmitting signal from the antenna. The receiver includes a first mixer for mixing the RF receiving signal and the output of the first variable phase shifter, and a second mixer for mixing the RF receiving signal and the output of the second variable phase shifter. The transmitter includes a third mixer for mixing an IF signal and the output of the first variable phase shifter, and a fourth mixer for mixing the IF signal and the output of the second variable phase shifter. Each of the first and second variable phase shifter has an input node for receiving an input signal, a first path and a second path for performing analog signal processing, an output node for combining the outputs of the first path and the second path to provide an output signal, and a bias controller for generating first and second bias signals in response to a phase control signal for controlling amplification of first and second active devices. The first path including a first fixed phase shift element for shifting the phase of the input signal by a first shift value, and the first active device for amplifying the output of the first phase shift element. The first active device is inductively coupled to a ground via a first element of the first fixed phase shift element. The second path includes a second fixed phase shift element for shifting the phase of the input signal by a second shift value, and the second active device for amplifying the output of the second phase shift element. The second active device is inductively coupled to a ground via a second element of the second fixed phase shift element.

In accordance with a further aspect of the present invention, there is provided a differential phase shifter that has first and second variable phase shifters for receiving input signals. Each of the input signals is similar in amplitude and 180° out of phase. Each of the first and second variable phase shifters has an input node for receiving the corresponding input signal, a first path and a second path for performing analog signal processing, an output node for combining the outputs of the first path and the second path to provide an output signal, and a bias controller for generating first and second bias signals in response to a phase control signal for controlling amplification of first and second active devices. The first path includes a first fixed phase shift element for shifting the phase of the input signal by a first shift value, and the first active device for amplifying the output of the first phase shift element. The first active device is inductively coupled to a ground via a first element of the first fixed phase shift element. The second path includes a second fixed phase shift element for shifting the phase of the input signal by a second shift value, and the second active device for amplifying the output of the second phase shift element. The second active device is inductively coupled to a ground via a second element of the second fixed phase shift element.

Other aspects and features of the present invention will be readily apparent to those skilled in the art from a review of the following detailed description of preferred embodiments in conjunction with the accompanying drawings.

BRIEF DESCRIPTION OF THE DRAWINGS

The invention will be further understood from the following description with reference to the drawings in which:

FIGS. 8A–8F are diagrams showing examples of the LC ladder of FIG. 3:

DETAILED DESCRIPTION OF THE PREFERRED EMBODIMENTS

Figure 2:
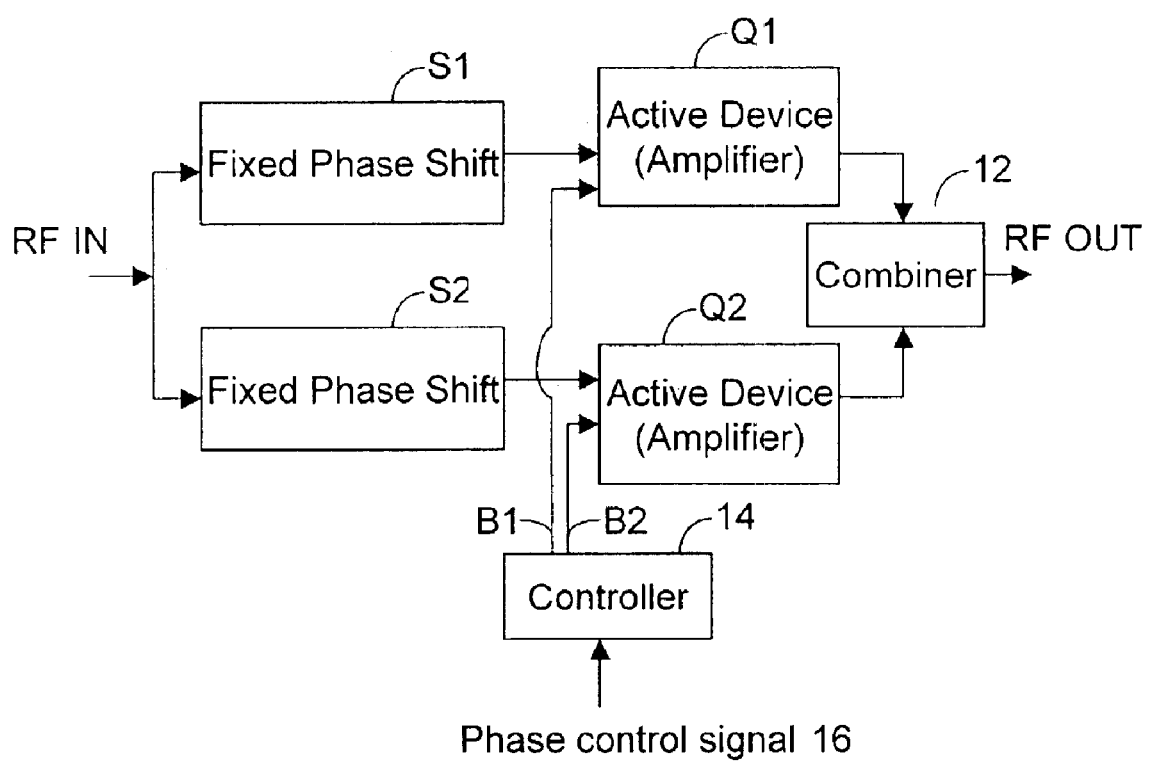
FIG. 2 is a block diagram showing a variable active phase shifter in accordance with an embodiment of the present invention.

FIG. 2 shows a variable active phase shifter 10 in accordance with an embodiment of the present invention. The phase shifter 10 includes fixed phase shift elements S1 and S2, active devices Q1 and Q2, and a combiner 12. The fixed phase shift elements S1 and S2 are connected to an input node RF IN. The fixed phase shift elements S1 and S2 phase-shift an input signal (e.g. RF signal) by predetermined shift values. The active devices Q1 and Q2 receive the outputs of the fixed phase shift elements S1 and S2, respectively, and amplify them. The controller 14 generates bias signals B1 and B2 in response to a phase control signal 16 for controlling the gain of the amplification of the active devices Q1 and Q2. The combiner 12 combines the outputs of the active devices Q1 and Q2. The combiner 12 is connected to an output node RF OUT.

In FIG. 2, two fixed phase shift elements S1 and S2 and two active devices Q1 and Q2 are shown. However, the active phase shifter 10 may have more than 3 fixed phase shift elements, and may have more than 3 active devices.

The active phase shifter 10 may be integrated into Radio Frequency Integrated Circuits (RFICs). The active phase shifter 10 may be part of a smart antenna front-end system and fabricated as System On a Chip (SOC).

Figure 3:
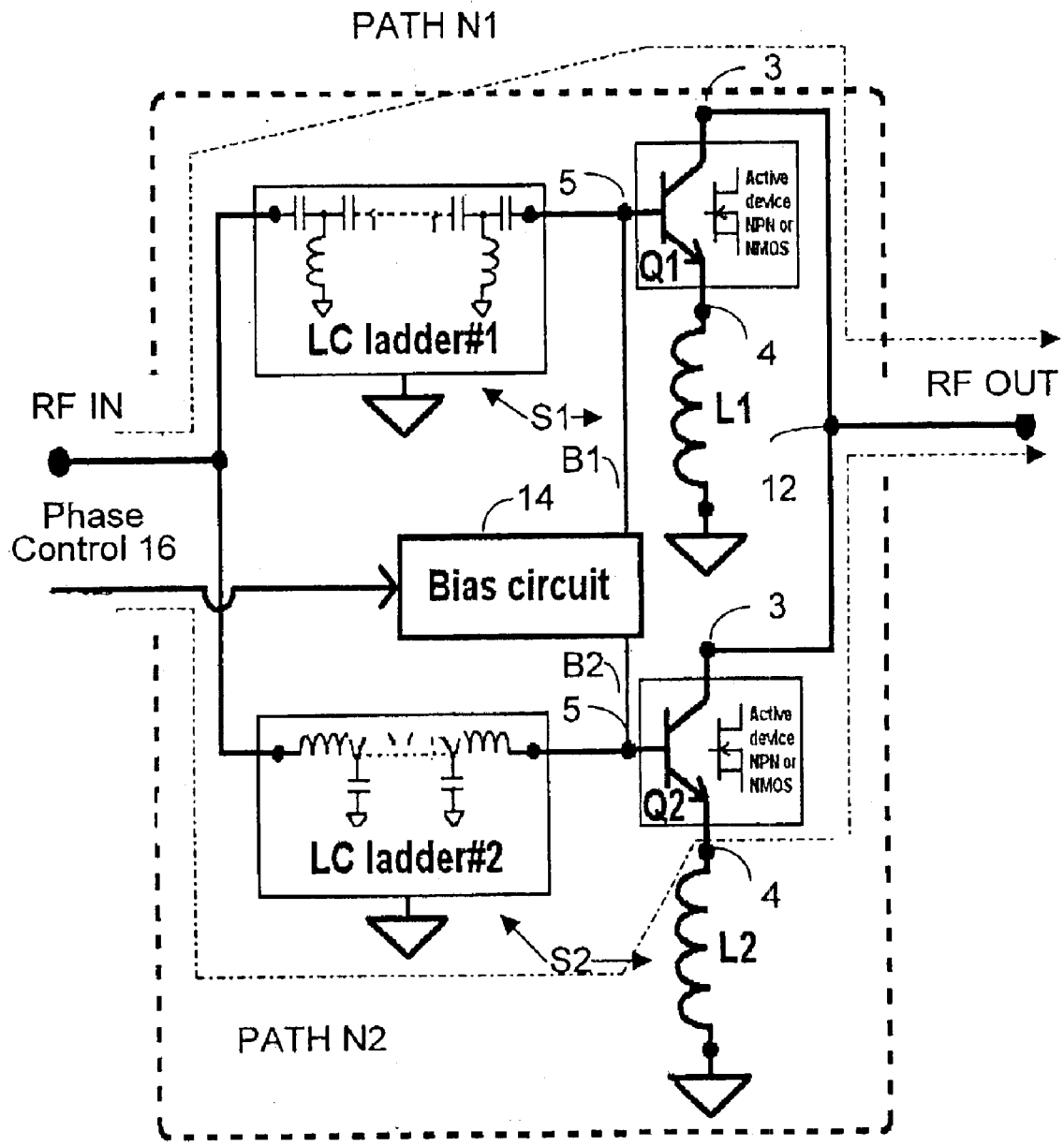
FIG. 3 is a diagram showing an example of the phase shifter 10 of FIG. 2.

FIG. 3 shows an example of the phase shifter 10 of FIG. 2. The fixed phase shift element S1 of FIG. 3 includes an LC ladder #1 and an inductor L1 (inductance L1). The fixed phase shift element S2 of FIG. 3 includes an LC ladder #2 and an inductor L2 (inductance L2). Each of the active devices Q1 and Q2 is a NPN or NMOS transistors, and a common source (or a emitter) amplifier. The combiner 12 of FIG. 3 is an adder, which is a node connected to the active devices Q1 and Q2.

Each of the LC ladder may include a resistor, an inductor, a capacitor or any combination of such elements. The phase shift element S1 acts as a sine component. The phase shift element S2 acts as a cosine component. To obtain different phase range, different phase shift components S1 and S2, are provided.

The LC ladders #1 and #2 are connected to the input node RF IN. The output of the LC ladder #1 is connected to the active node 5 of the active device Q1. The output of the LC ladder #2 is connected to the active node 5 of the active device Q2. The active node 5 may be a gate or a base.

The inductors L1 and L2 are used for balancing gain and phase. The inductor L1 is connected between the ground and the node 4 of the active device Q1. The inductor L2 is connected between the ground and the node 4 of the active device Q2. The node 4 may be a source or an emitter. The nodes 3 of the active devices Q1 and Q3 are connected to the adder 12. The node 3 may be a drain or a collector. The adder 12 is connected to the output node RF OUT.

The active device Q1 connects the inductor L1 to the adder 12 in response to the voltage of the node 5. The active device Q2 connects the inductor L2 to the adder 12 in response to the voltage of the node 5.

The bias controller 14 of FIG. 3 is connected to the active nodes 5 of the active devices Q1 and Q2 to control their bias based on the phase control signal 16. The nodes 5 of the active devices Q1 and Q2 receive the bias signals B1 and B2 from the bias controller 14, respectively.

As described above, the adder 12 of FIG. 3 is a connection node. As the outputs (e.g., collectors or drains) of the active devices Q1-Q2 are current sources, power combination is achieved by connecting collectors or drains of the active devices Q1 and Q2 in one node 12.

The output of the adder 12 meets the following equation (1).

$$A_1 \mathrm{Sin}(\omega t) + A_2 \mathrm{Cos}(\omega t) = \sqrt{A_1^2 + A_2^2} \times \mathrm{Sin}\left(\omega t + \tan^{-1}\left(\frac{A_2}{A_1}\right)\right) \quad (1)$$

where $A_1$ represents gain (voltage) X input signal (peak voltage) of path N1, $A_2$ represents gain (voltage) X input signal (peak voltage) of path N2, $\omega$ represents the frequency of the input signal. In FIG. 3, the path N1 includes the LC ladder #1 and the active device Q1, and the path N2 includes the LC ladder#2 and the active device Q2.

To control output phase, bias (gain) of two sine and cosine components are set as follows:

$$A_1 \propto \frac{I_c(Q_1)}{L_1} \quad (2)$$

$$A_2 \propto \frac{I_c(Q_2)}{L_2} \quad (3)$$

where $I_c(Q_1)$ represents Idc current of the device Q1, and $I_c(Q_2)$ represents Idc current of the device Q2.

For $A_1$ (0→1) and $A_2$ (0→1), therefore $$\left(\frac{A_2}{A_1}\right)$$

is from 0 to ∞, and output phase control $$\tan^{-1}\left(\frac{A_2}{A_1}\right)$$

will be (0→90°).

Preferably, the inductors L1 and L2 are fabricated by bondwire, and may be on-chip inductors. The active devices Q1 and Q2 may be Si BJT, Si Bi-CMOS, Si CMOS, SiGe Bi-CMOS, SiGe HBT, GaAs HBT or GaAs MESFET. Value of L1 and L2 and size of Q1 and Q2 may be different to compensate for gain variation. To increase phase range, two or more phase shifter may be use in series.

Figure 4B:
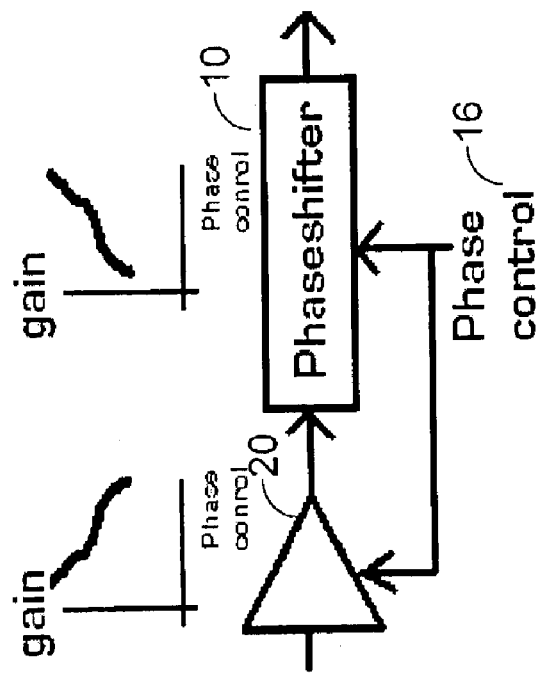
FIG. 4B is a diagram showing an additional component applied to the phase shifter of FIG. 2.
Figure 4A:
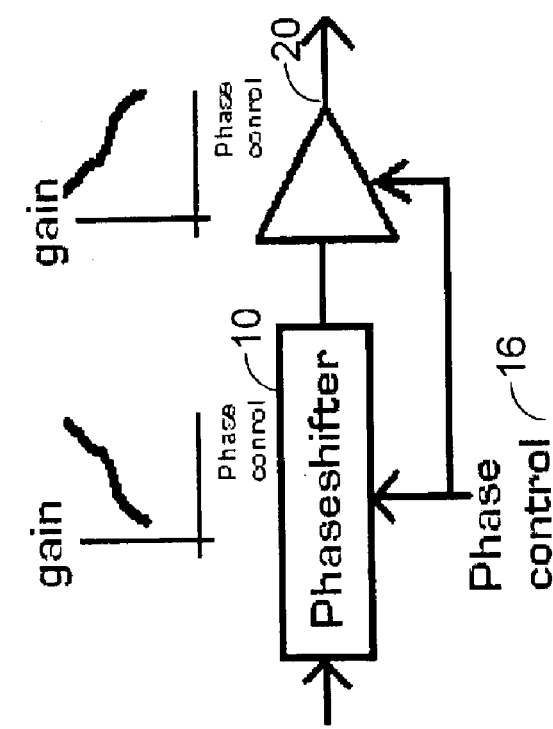
FIG. 4A is a diagram showing an additional component applied to the phase shifter of FIG. 2.

To compensate for unwanted gain variation of the phase shifter 10, an amplifier may be provided to the phase shifter 10. FIGS. 4A and 4B show how the gain of the phase shifter 10 is adjusted using an amplifier 20. In FIG. 4A, the amplifier 20 is connected to the output of the phase shifter 10. In FIG. 4B, the amplifier 20 is connected to the input of the phase shifter 10. The phase control signal 16 is applied to the phase shifter 10 and the amplifier 20. Based on the phase control signal 16, the gain of the phase shifter 10 is adjusted using a lookup table for calibration. The amplifier 20 may be a low noise amplifier (LNA).

Figure 1:
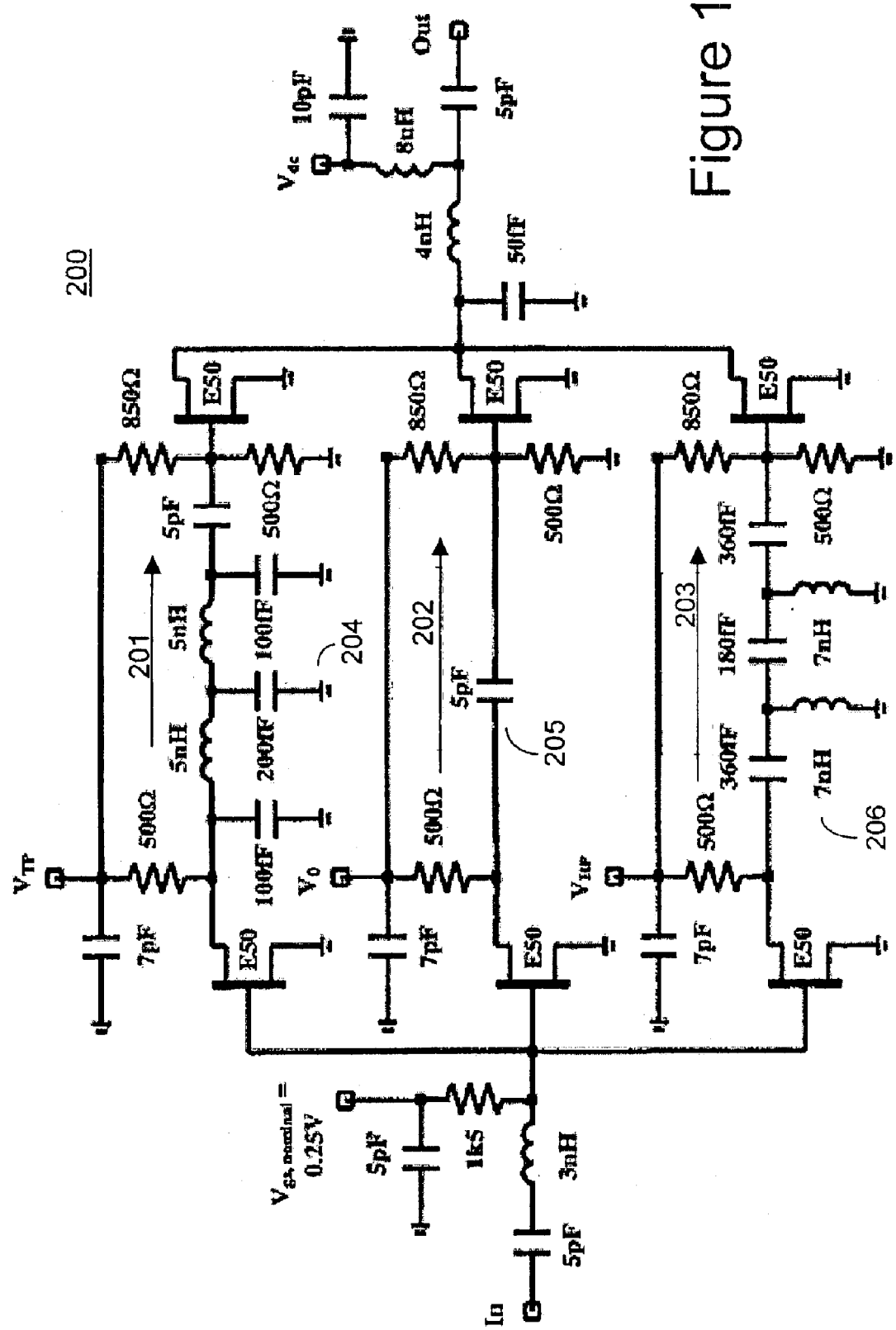
FIG. 1 is a schematic diagram showing a conventional vector modulator.
Figure 5:
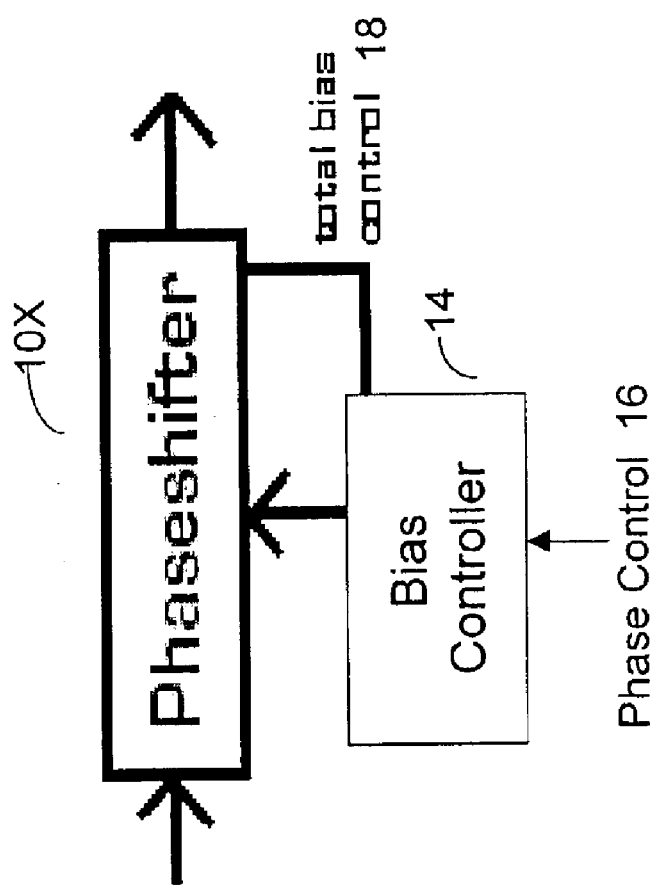
FIG. 5 is a diagram showing a further example of the phase shifter of FIG. 2.

FIG. 5 shows a further example of the phase shifter 10 to compensate for gain variation. In FIG. 5, the bias controller 14 is shown separately from a phase shifter 10X. The phase shifter 10X is similar to the phase shifter 10 of FIG. 1 and has similar elements as those of the phase shifter 10 except for the bias controller 14. The phase shifter 10X outputs a total bias control signal 18, which is applied to the bias controller 14. When the bias controller 14 receives the total bias control signal 18, the bias controller 14 changes the values of the bias signals B1 and B2 without changing their ratio.

The total bias control signal is, for example, the total bias of the phase shifter 10. In FIG. 3, total bias is, for example, expressed by (base current $I_{B1}$ of Q1+base current $I_{B2}$ of Q2), and is proportional to gain of the phase shifter 10.

Figure 6:
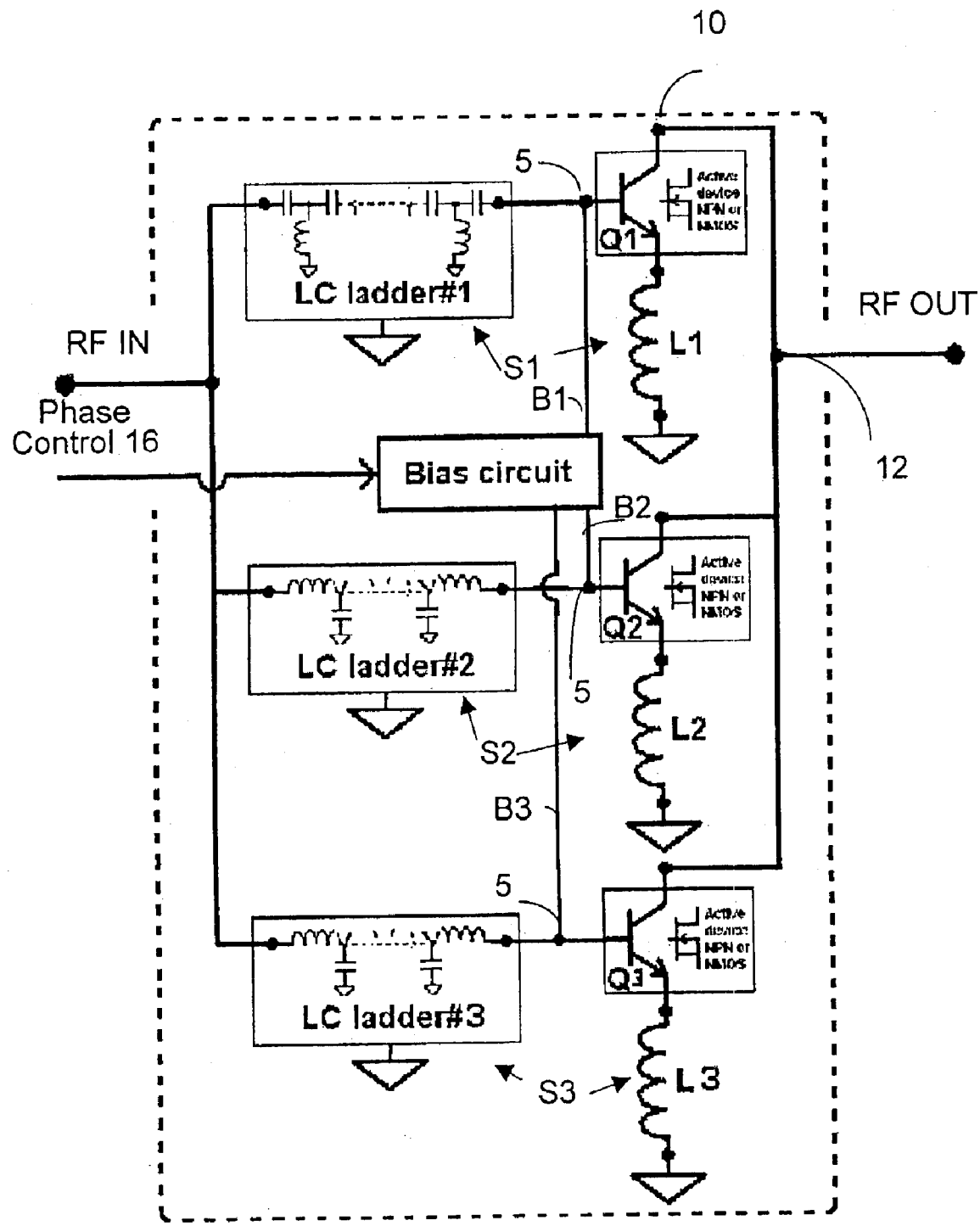
FIG. 6 is a schematic diagram showing a further example of the phase shifter of FIG. 2.
Figures 7A, 7B:
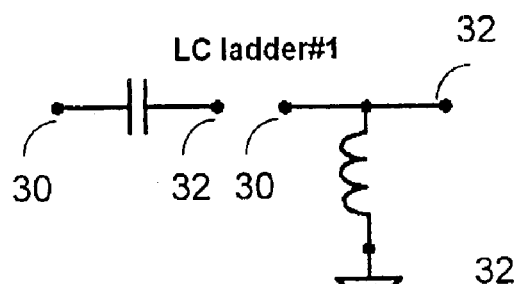
FIGS. 7A–7F are diagrams showing examples of the LC ladder of FIG. 3.
Figures 7C, 7D:
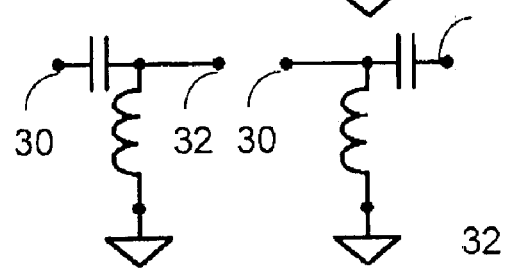
Figures 7E, 7F:
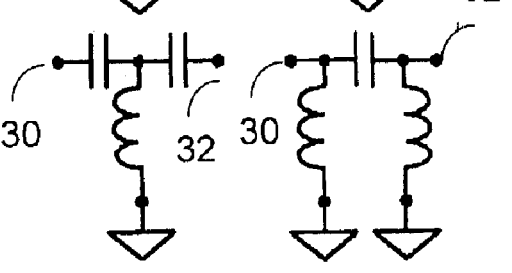

FIG. 6 illustrates a schematic diagram showing a further example of the phase shifter 10 of FIG. 2. The phase shifter 10 of FIG. 6 includes the fixed phase shift elements S1–S3. The fixed phase shift element S3 has an LC ladder #3, an inductor L3 and an active device Q3. The active device Q3 is activated by the output of the LC ladder #3 and connects the inductor L3 to the adder 12.

The LC ladder #3 may be similar to the LC ladder #1 or #2, and have a resister to adjust the gain, an inductor, a capacitor or any combination of these elements. The active device Q3 may be a NPN or NMOS transistor, and is similar to the active devices Q2–Q3. The Inductor L3 may be similar to the inductors L1–L2.

The bias controller 14 is connected to the active nodes 5 of the active devices Q1–Q3, and generates bias signals B1–B3 in response to the phase control signal 16 to control the bias of the active devices Q1–Q3. In FIG. 6, three fixed phase shift elements S1–S3 are shown. However, the phase shifter 10 may include more than four fixed phase shift elements and the corresponding active devices.

The fixed phase shift element of the phase shifter 10 shown in FIG. 4 is further described in detail. FIGS. 7A–7F show examples of the LC ladder #1 of FIG. 3. FIGS. 8A–8F show examples of the LC ladder #2 of FIG. 3. In FIGS. 7A–7F and 8A–8F, a node 30 is connected to the node RF IN shown in FIG. 2, and a node 32 is connected to the active devices Q1 and Q2 so as to control their activations.

Figures 9A, 9B, 9C:
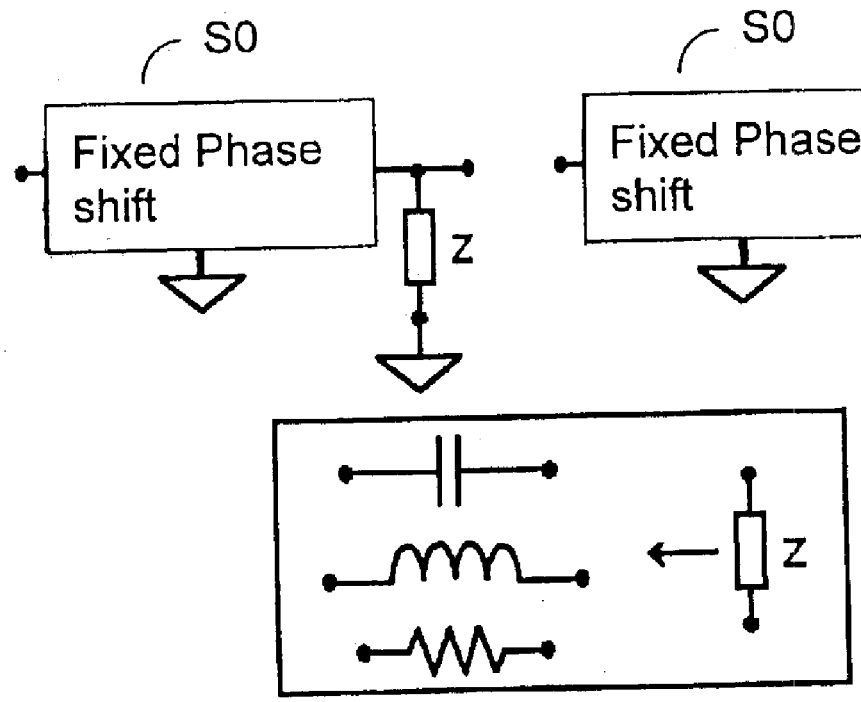
FIG. 9A is a diagram showing an additional component combined with the fixed phase shift element of FIG. 2.
FIG. 9B is a diagram showing an additional component combined with the fixed phase shift element of FIG. 2.
FIG. 9C is a diagram showing the examples of the additional components of FIGS. 9A–9B.

Additional component may be provided to the fixed phase shift element shown in FIG. 2 for impedance matching as shown in FIGS. 9A–9B. FIGS. 9A–9B show examples of additional components combined with the fixed phase shift element of FIG. 2. As shown in FIGS. 9A–9B, a component Z may be connected to a fixed phase shift element S0. The fixed phase shift element SO may be the fixed phase shift element S1, S2 or S3 shown in FIGS. 2, 3 and 6. FIG. 9C shows examples of the component Z. The component Z is may be a capacitor, an inductor, a resistor or any combination of these elements, and may be added to the input node and/or the output node of the fixed phase shift element S0.

Figure 10:
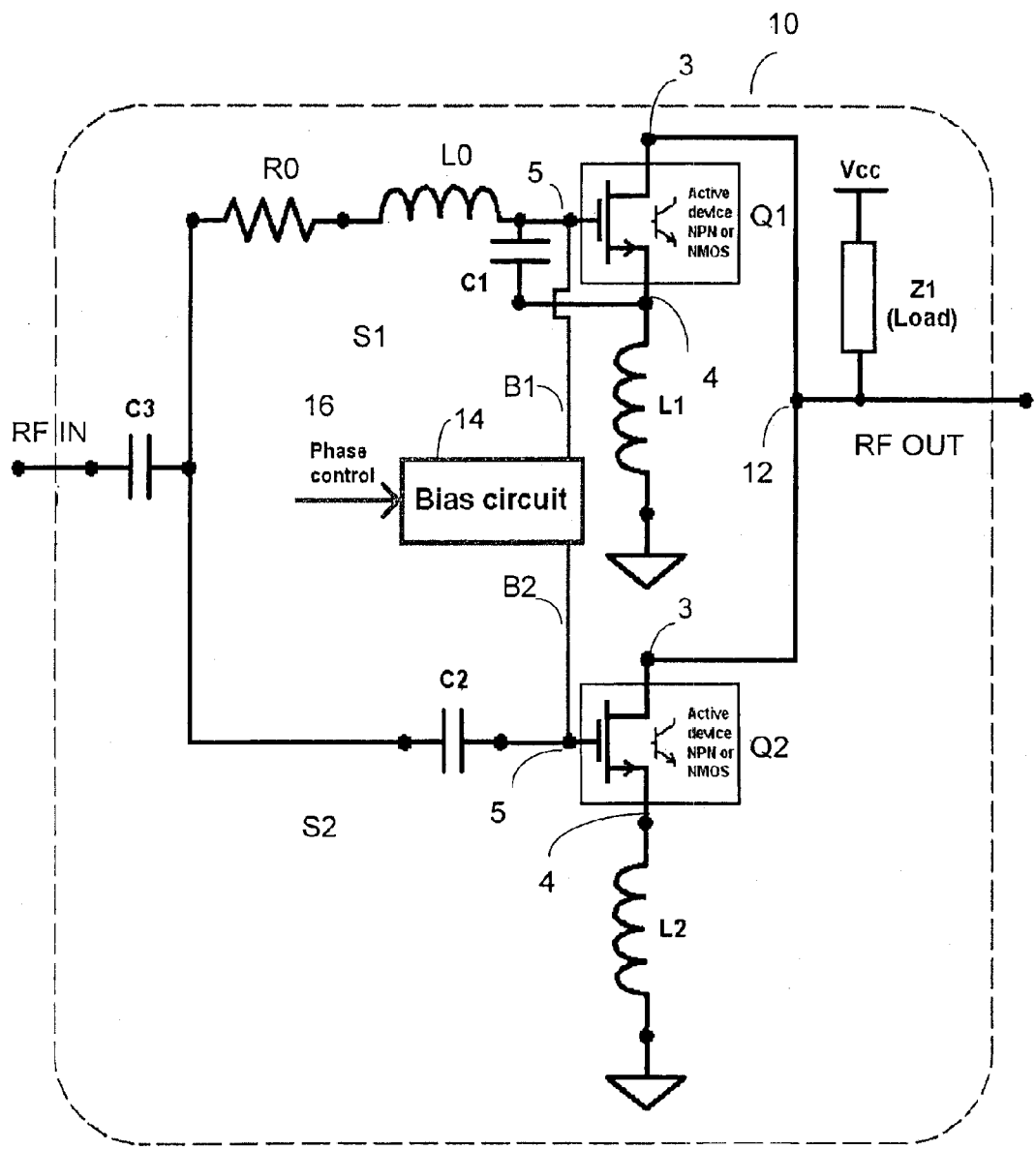
FIG. 10 is a schematic diagram showing a further example of the phase shifter of FIG. 2.

FIG. 10 illustrates a schematic diagram showing a further example of the phase shifter 10 of FIG. 2. The phase shift element S1 of FIG. 10 includes a inductors L0 and L1, and a capacitor C1. "R0" in FIG. 10 represents series resistance (Q) of L0. The inductor L0 is connected to the active node 5 of the active device Q1. The, capacitor C1 is connected between the nodes 4–5 of the active device Q1. The phase shift element S2 of FIG. 10 includes the inductor L2 and a capacitor C2. The capacitor C2 is connected to the active node 5 of the active device Q2. Between the input node RF IN and the inputs of the first and second fixed phase shift elements S1 and S2, a capacitor C3 is provided for input impedance matching. Further, a load component Z1 is connected to the output node RF OUT.

Preferably, the inductors L1 and L2 are inductors fabricated by bondwire, and the inductor L0 is on-chip inductor.

The phase shift element S1 may include a resistor, or may include more than one inductor. Such resistor(s) and/or inductor(s) may be connected in series. The phase shift element S2 may include more than one capacitor, which are connected in series. Further, a series of capacitors/inductors may be provided between the input node RF IN and the inputs of the fixed phase shift elements.

Figure 11:
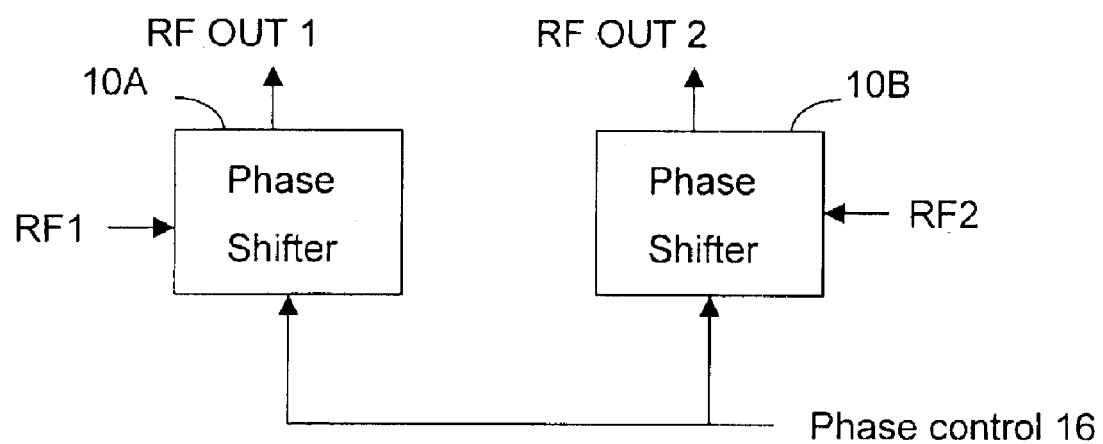
FIG. 11 is a schematic diagram showing a further embodiment of the phase shifter of FIG. 10.

FIG. 11 shows a further embodiment of a phase shifter of FIG. 10. The differential phase shifter of FIG. 11 includes a phase shifter 10A and 10B. The phase shifters 10A–10B are similar to the phase shifter 10 of FIG. 10.

The phase shifter 10A receives an input signal RF1, and the phase shifter 10B receives an input signal RF2. Two input signals RF1 and RF2 are equal in amplitude and 180° out of phase. The phase control signal 16 is provided to the bias controllers 14 in the phase shifters 10A and 10B. The outputs of the phase shifters 10A and 10B, i.e. RF OUT1 and RF OUT2, are same signal and 180° out of phase.

Figure 12:
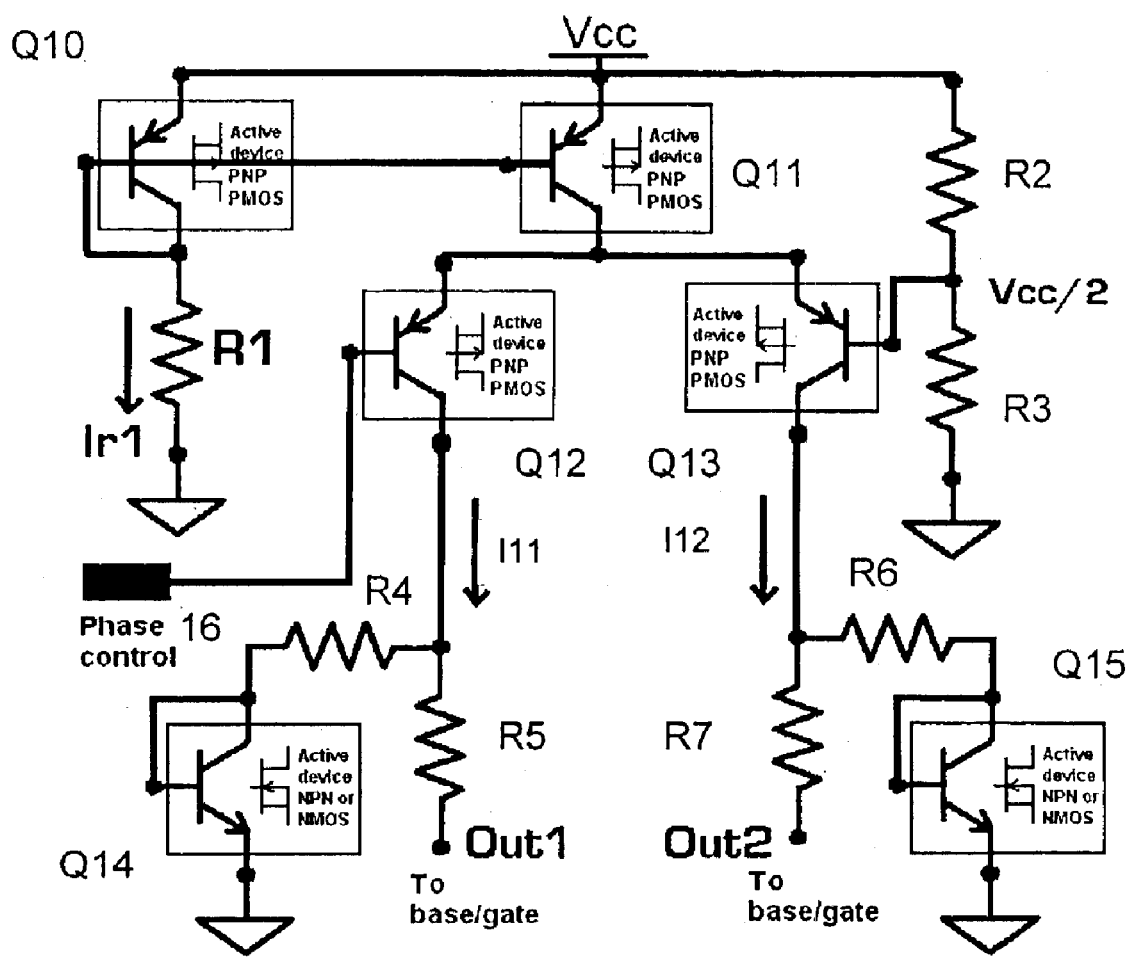
FIG. 12 is a schematic diagram showing an example of the bias controller of FIG. 2.

The bias controller 14 of FIG. 2 is further described in detail. FIG. 12 shows an example of the bias controller 14 of FIG. 2. The bias controller 14 of FIG. 12 includes a current mirror circuit to provide two signals from output nodes Out 1 and Out 2.

The bias controller 14 includes active devices Q10–Q15, resistors R1–R7. The active devices Q10–Q13 may be a PNP or a PMOS transistor. The active devices Q14–Q15 may be a NPN or a NMOS transistor. The connection node of the resistors R2–R3 is set to Vcc/2. The active amplifier Q12 is connected between the active amplifier Q11 and the resistor R5, and is activated by the phase control signal 16. The active amplifier Q13 is connected between the active amplifier Q11 and the resistor R7, and is activated by the Vcc/2.

The output node Out1 of the bias controller 14 is connected to the active device (e.g. Q1 of FIG. 2) of the phase shifter (i.e. 10 of FIGS. 2, 3 and 6). The output node Out2 of the bias controller 14 is connected to the active device (e.g. Q2 of FIG. 2) of the phase shifter 10.

Current I11 between the active amplifier Q12 and the resistor R5 and current I12 between the active amplifier Q13 and the resistor R7 meet the equation (4).

$$I11+I12 = \text{constant} \tag{4}$$

Figure 13:
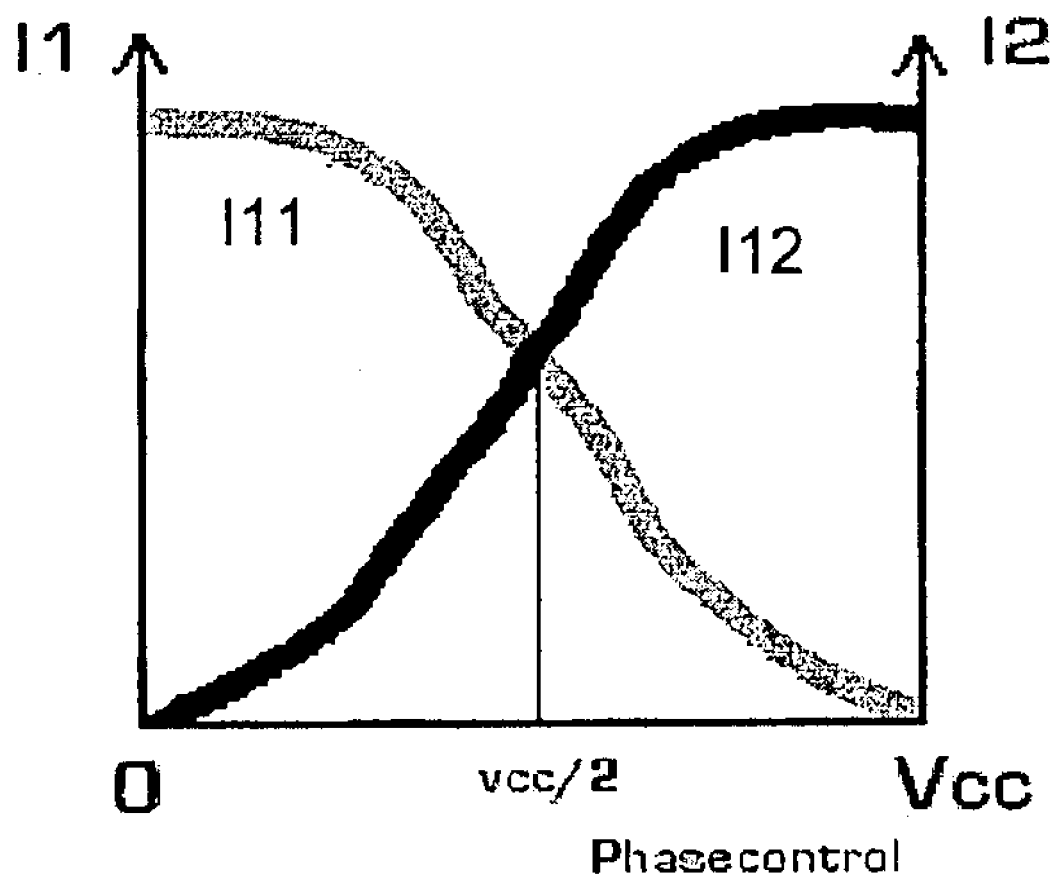
FIG. 13 is a graph showing the operation of the bias controller of FIG. 12.

The sum of I11 and I12 is controlled by the value of the resistor R1 and mirror ratio, i.e. the ratio of size of the PNPs (or of PMOSs) Q10–Q11. FIG. 13 shows how the current I1 and I12 are changed by the phase control signal 16. As shown in FIG. 13, when the voltage of the phase control signal 16 is equal to Vcc/2, which is a gate/base voltage of the active amplifier Q13, the current I11 is equal to the current I12.

Figure 14:
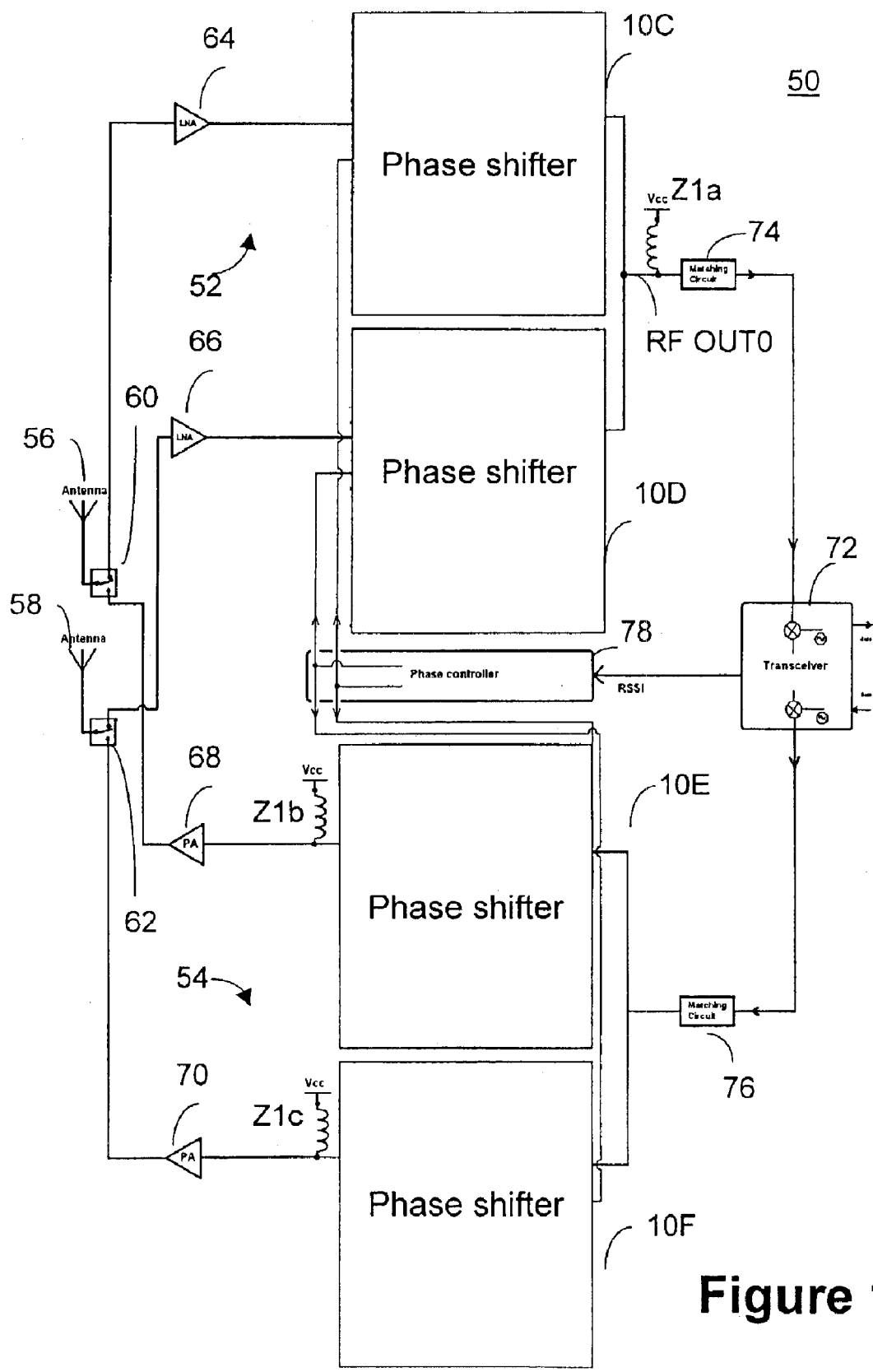
FIG. 14 is a block diagram showing a smart antenna front-end/transceiver system using the phase shifter of FIG. 2.
Figure 15:
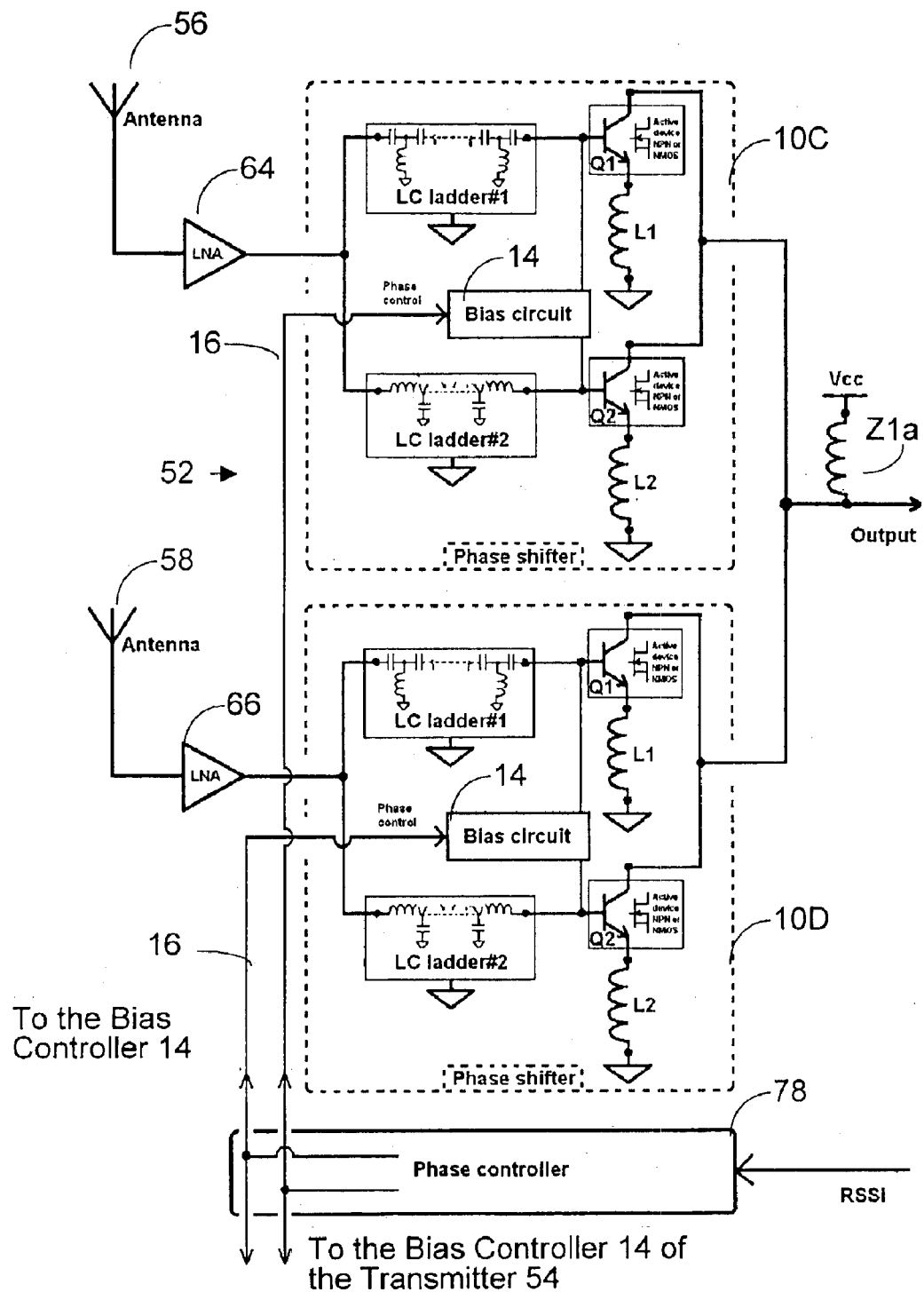
FIG. 15 is a diagram showing an example of a smart receiver for the smart antenna front-end/transceiver system of FIG. 14.
Figure 16:
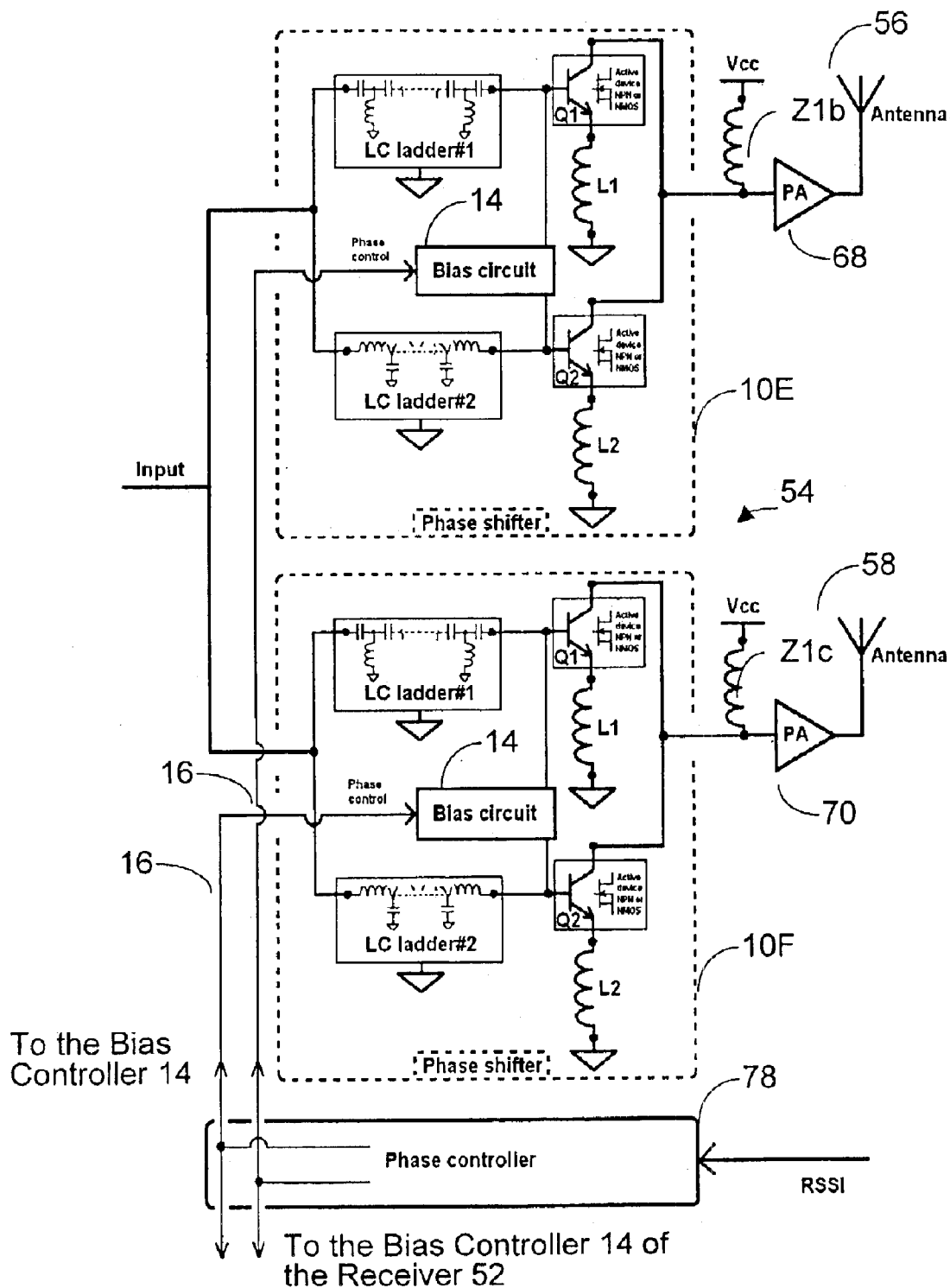
FIG. 16 is a diagram showing an example of a smart transmitter for the smart antenna front-end/transceiver system of FIG. 14.

A smart antenna front-end is now described in detail. FIG. 14 shows an example of a smart antenna front-end/transceiver system 50 using the phase shifter 10 of FIG. 2. The smart antenna front-end/transceiver system 50 includes a smart receiver 52 and a smart transmitter 54. FIG. 15 shows an example of the smart receiver 54 for the smart antenna front-end system of FIG. 14. FIG. 16 shows an example of the smart transmitter 54 for the smart antenna front-end/transceiver system 50 of FIG. 14.

The smart receiver 52 includes the phase shifters 10C and 10E. The smart transmitter 54 includes the phase shifters 10D and 10F. The phase shifters 10C–10F may be similar to the phase shifter 10 shown in FIG. 3, 6 or 10.

An antenna 56 is provided to the phase shifters 10C and 10E. An antenna 58 is provided to the phase shifters 10D and 10F. One of the phase shifter 10C and 10E is selectively connected to the antenna 56 by a switch 60. One of the phase shifter 10B and 10D is selectively connected to the antenna 58 by a switch 62. A connection node RF OUT0 connects the output node RF OUT of the phase shifter 10C and the output node RF OUT of the phase shifter 10D.

As described above, power combination is achieved with connected collectors or drains of active devices in the phase shifters.

A transceiver 72 receives the output of the phase shifter 10C and/or 10D, and processes it to output data to a processor (not shown). The transceiver 72 receives data from the processor (not shown) and outputs an RF single to the phase shifters 10E and 10F.

A matching circuit 74 may be provided between the phase shifter 10C and 10D and the transceiver 72 for impedance matching to the input of the transceiver 70 (e.g., 50 ohms). A component Z1a may be connected to the output node RF OUT0 as described in FIGS. 9A–9C.

A matching circuit 76 may be provided between the phase shift elements 10D and 10F and the transceiver 70 for impedance matching to the input of transceiver 70 (e.g. 50 ohms). Components Z1b–Z1c may be connected to the output nodes RF OUT of the phase shifter 10E and 10F, respectively, as described in FIGS. 9A–9C.

The transceiver 72 has a received signal strength indicator (RSSI). The RSSI outputs a signal corresponding the received RF signal strength. The output signal (referred to as RSSI) is supplied to the phase controller 78. The phase controller 78 outputs the phase control signal 16 based on the RSSI. The phase control signal 16 is provided to the bias controller 14 of each phase shifter. Accordingly, during receiving RF signal, the phase controller 78 changes the phase of the input RF signal and monitor RSSI to maximize the strength of the receiving RF signal. Further, the phase controller 78 keeps phase status (voltages) in its memory (not shown) and uses the phase status for transmission.

LNAs 64 and 66 may be provided to the inputs (i.e. RF IN of FIG. 2) of the phase shifter 10C and 10D, respectively, as described in FIG. 4A. Power Amplifiers (PAs) 68 and 70 may be provided to the outputs (i.e. RF OUT of FIG. 2) of the phase shifter 10E and 10F, respectively, as described in FIG. 4B.

In FIG. 14, two antennas 56 and 58 are shown. However, more than two antennas may be provided for better reception of RF signals.

Figure 17:
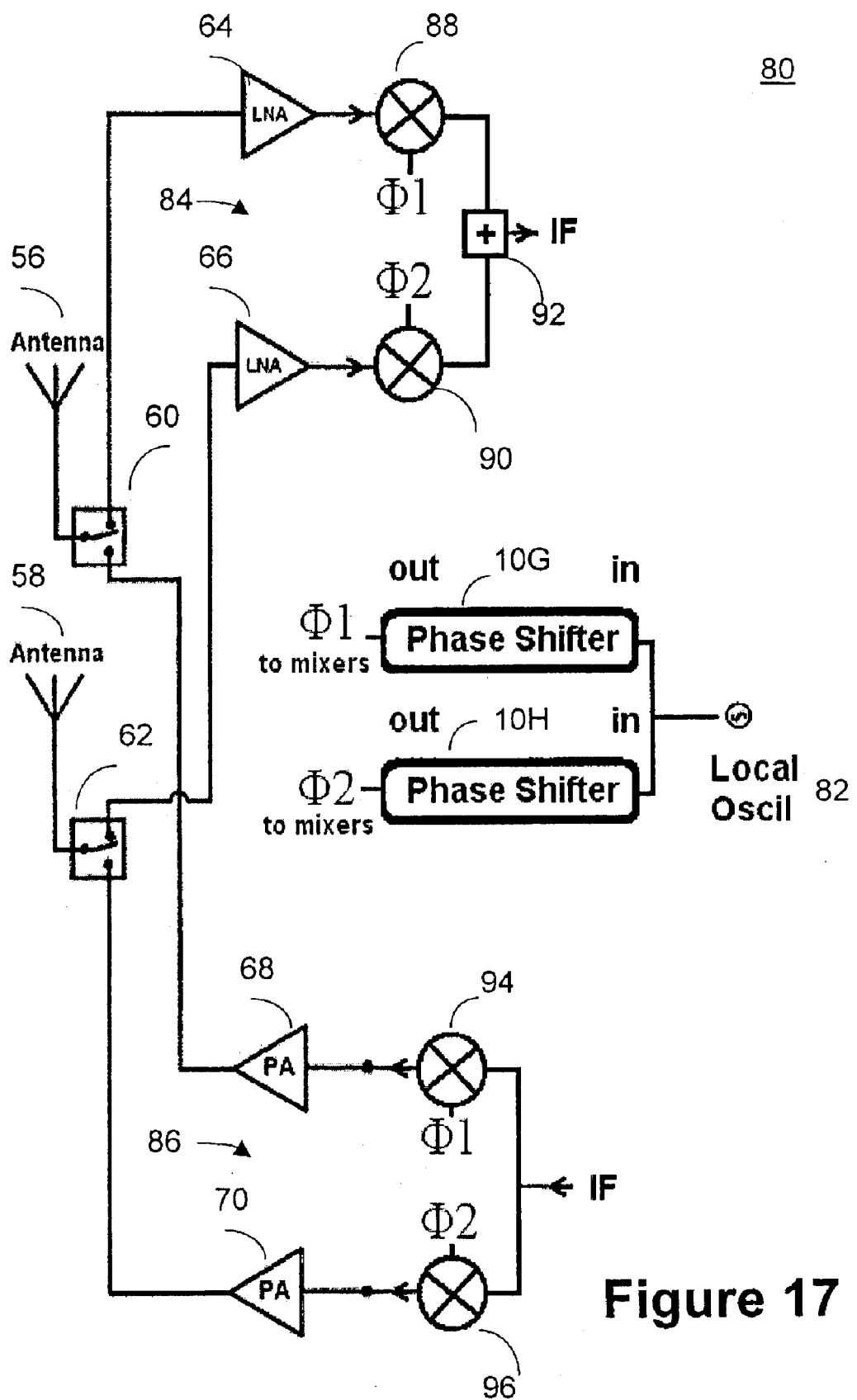
FIG. 17 is a block diagram showing a further example of a smart antenna front-end/transceiver system using the phase shifter of FIG. 2.

FIG. 17 shows a further example of a smart antenna front-end/transceiver system 80 using the phase shifter 10 of FIG. 2. The smart antenna front-end/transceiver system 80 of FIG. 17 includes phase shifters 10G and 10H. The phase shifters 10G and 10H receive the output of a local oscillator 82 and output signals φ1 and φ2, respectively. The phase shifters 10G and 10H may be similar to the phase shifter 10 shown in FIG. 3, 6 or 10. The smart antenna front-end system 80 further includes a smart receiver 84 and a smart transmitter 86.

The smart receiver 84 includes mixers 88 and 90 and an adder 92. The signals φ1 and φ2 are mixed with the outputs of the LNAs 64 and 66 at the mixers 88 and 90, respectively. The adder 92 adds the outputs of the mixers 88 and 90 and outputs an IF signal with a desired phase.

The smart transmitter 86 includes mixers 94 and 96. The signals φ1 and φ2 are mixed with an IF signal at the mixers 94 and 96, respectively. The transmitter 86 outputs an RF signal with a desired phase.

Figure 18:
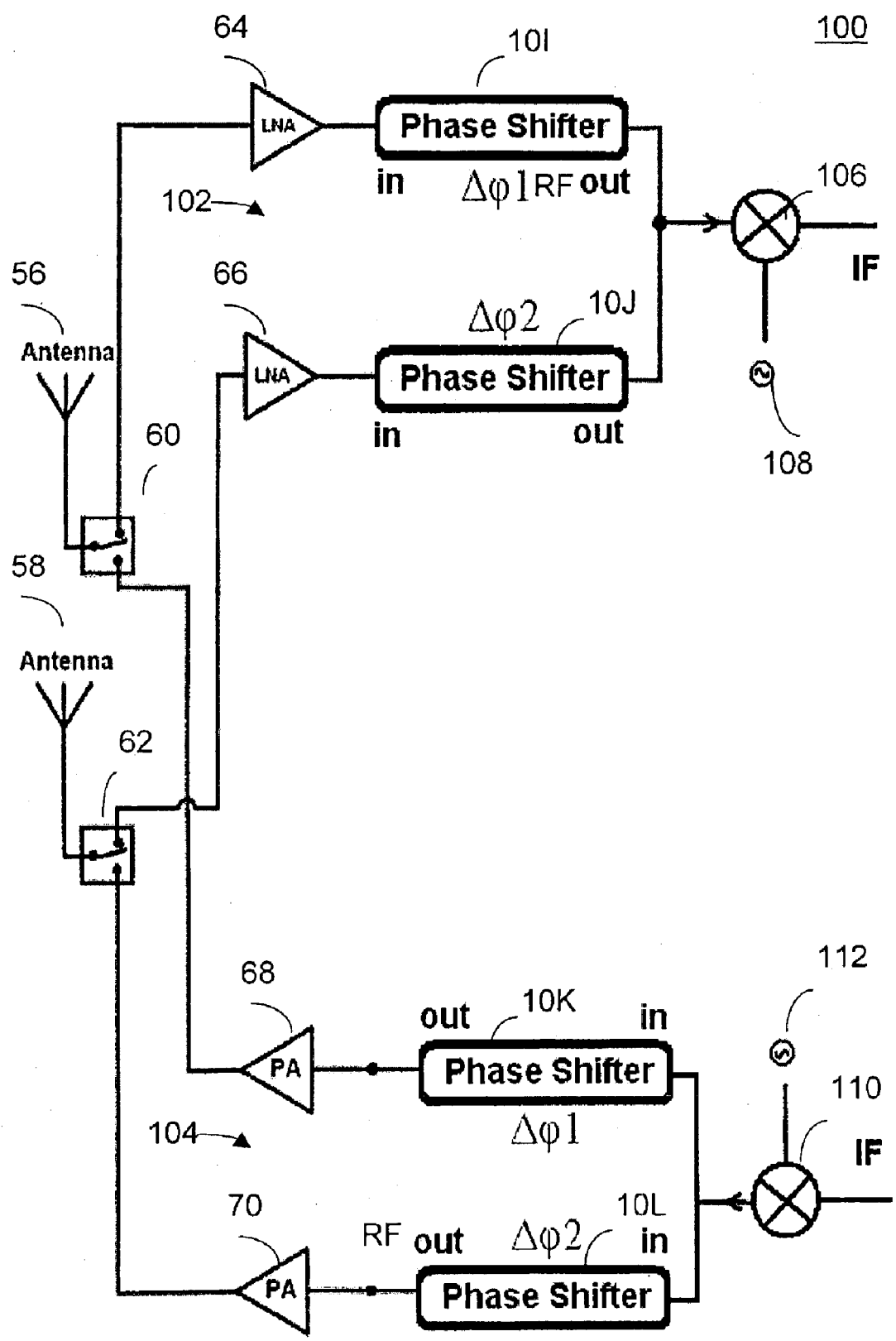
FIG. 18 is a diagram showing anther example of a smart antenna front-end/transceiver system using the phase shifter of FIG. 2.

FIG. 18 shows a further example of a smart antenna front-end/transceiver system 100 using the phase shifter 10 of FIG. 2. The smart antenna front-end/transceiver system 100 includes a smart receiver 102 and a smart transmitter 104. The smart receiver 102 includes phase shifters 10I and 10J. The smart transmitter 104 includes phase shifters 10K and 10L. The phase shifters 10I–10L may be the phase shifter 10 shown in FIG. 3, 6 or 10.

At a receiving side, the outputs of the phase shifters 10I and 10J are inputted to a mixer 106. The mixer 106 mixes its input with the output of a local oscillator 108 to output an IF signal. At a transmitting side, a mixer 110 mixes an IF signal with the output of a local oscillator 112. The output of the mixer 110 is provided to the phase shifters 10K and 10L.

Figure 19:
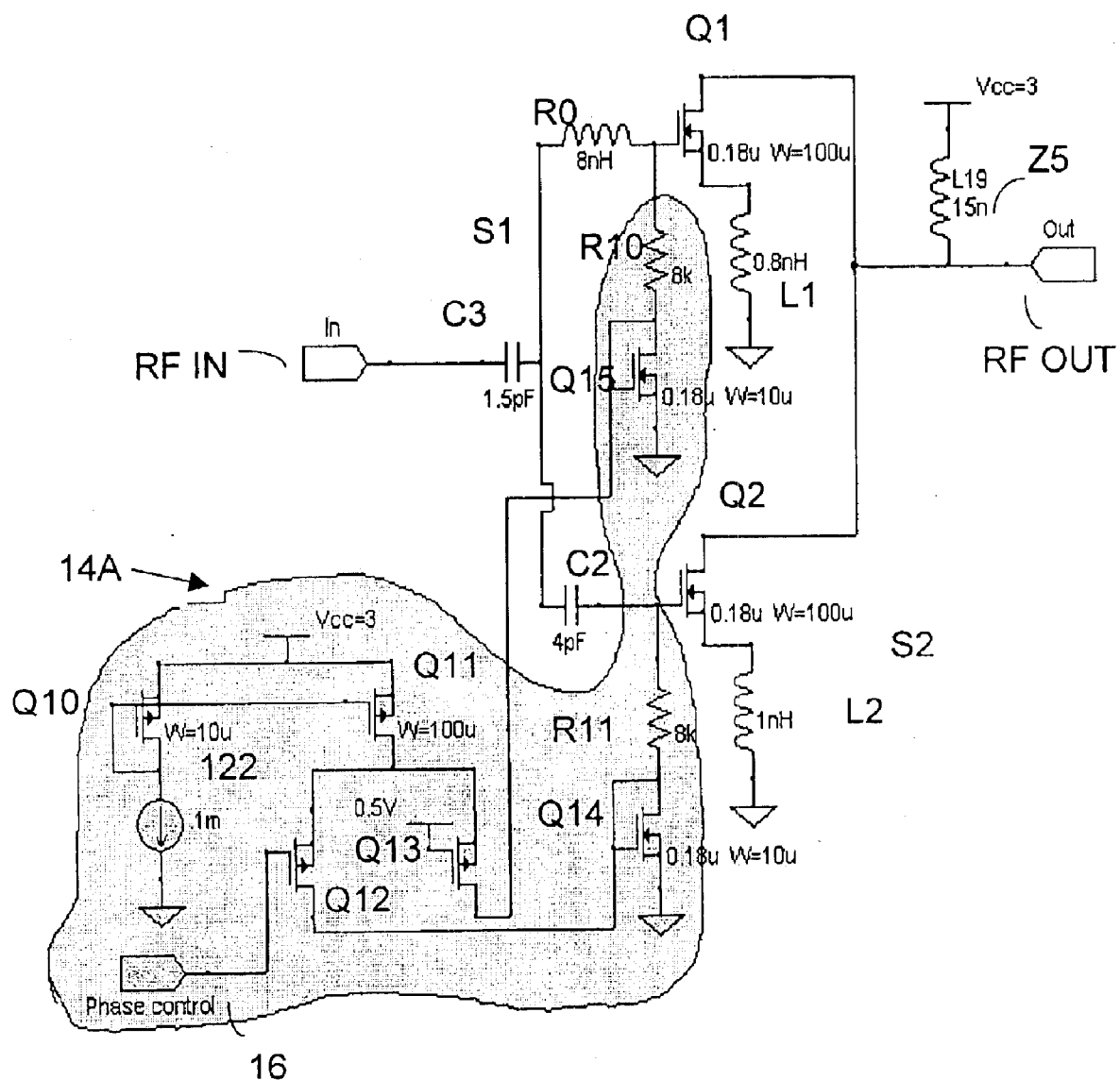
FIG. 19 is a schematic diagram showing a 2.5 GHz phase shifter of FIG. 2 implemented in 0.18 $\mu$m CMOS.

FIG. 19 shows a 2.5 GHz phase shifter 10 of FIG. 2 implemented in 0.18 μm CMOS. The fixed phase shift element S1 of FIG. 19 includes the transistor R0 (8 nH) and the inductor L1 (0.8 nH). The fixed phase shift element S2 of FIG. 19 includes the capacitor C2 (4 pF) and the inductor L2 (1 nH). The bias controller 14A of FIG. 19 includes PMOS transistors Q10 (W=10μ), Q11 (W=100μ), Q12–Q23, NMOS transistors Q14–Q15 (0.18 μ, W=10μ), a current source 120 (1 m) and resistors R10–R11(8 k). A component Z5 is provided to the output node RF OUT.

Figure 20:
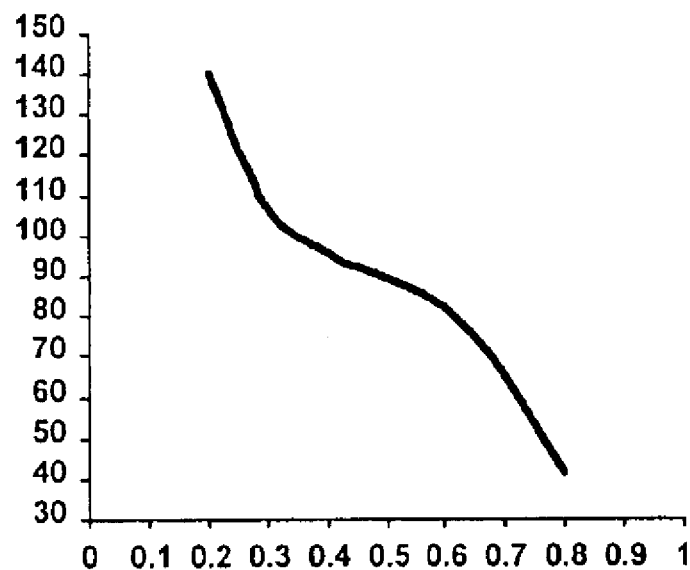
FIG. 20 is a graph showing phase (°) vs. control voltage for the phase shifter of FIG. 19.
Figure 21:
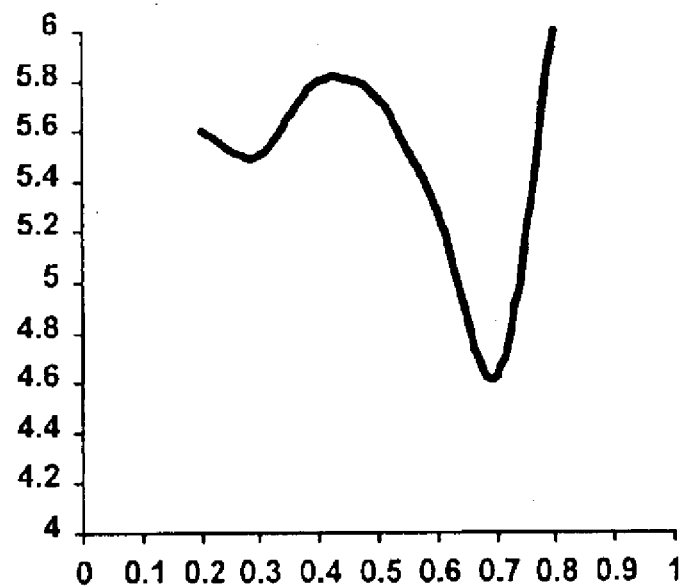
FIG. 21 is a graph showing gain (dB) vs. control voltage for the phase shifter of FIG. 19.

FIG. 20 shows phase (°) of the output signal on RF OUT vs. phase control voltage (i.e., voltage of the phase control signal 16) for the phase shifter of FIG. 19. FIG. 21 shows gain (db) vs. control voltage for the phase shifter of FIG. 19.

Figure 22:
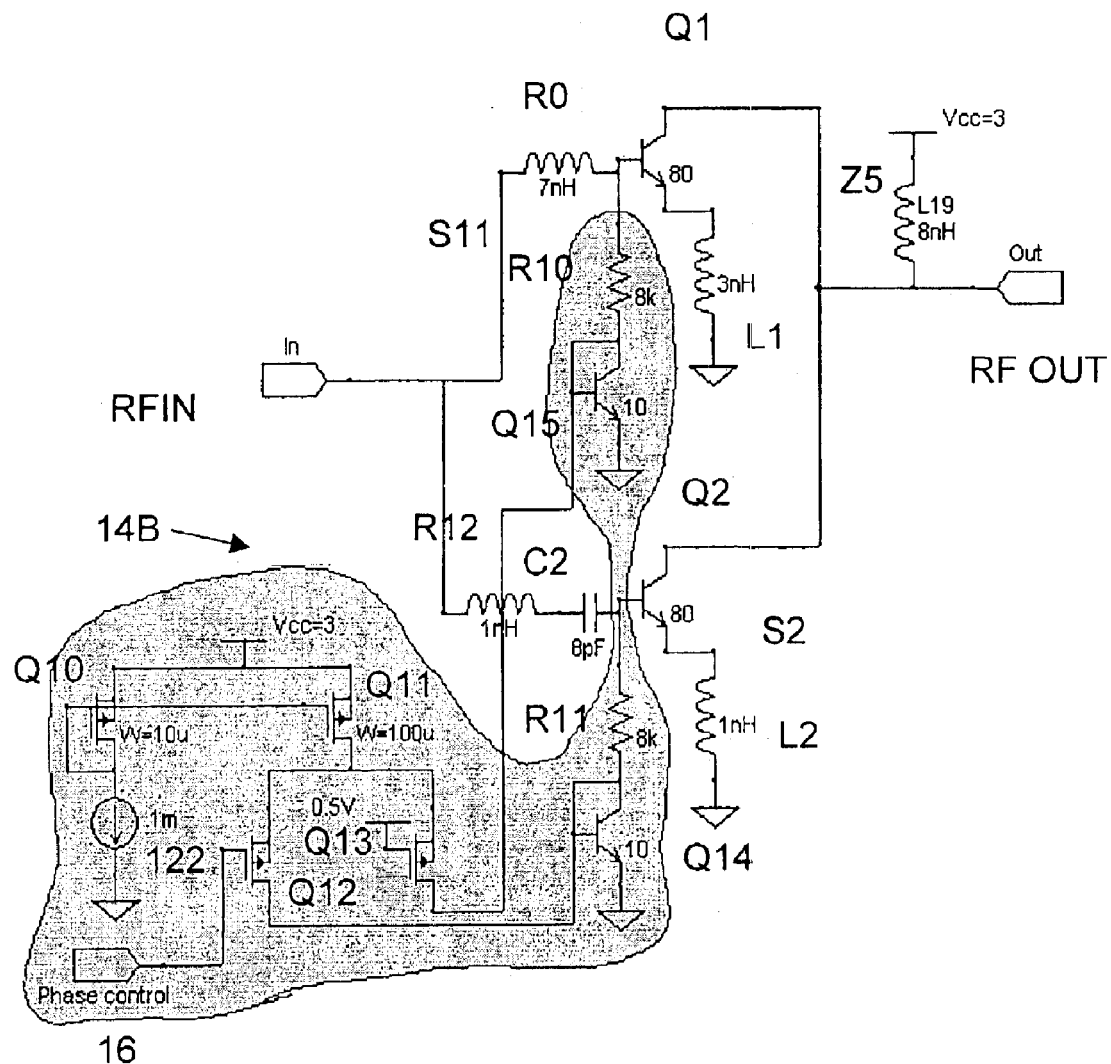
FIG. 22 is a schematic diagram showing a 2.5 GHz phase shifter of FIG. 2 implemented with bipolar transistor.

FIG. 22 shows a 2.5 GHz phase shifter 10 implemented with bipolar transistor. The fixed phase shift element S1 of FIG. 22 includes the resistor R0 (7 nH) and the inductor L1 (3 nH). The fixed phase shift element S2 of FIG. 22 includes the resistor R12(1 nH), the capacitor C2 (8 pF) and the inductor L2(1 nH). The bias controller 14B shown in FIG. 22 includes PMOS transistors Q10 (W=10μ), Q11 (W=100μ), Q12–Q23, NPN transistors Q14–Q15, a current source 120 (1 m) and resistors R10–R11 (8 k).

Figure 23:
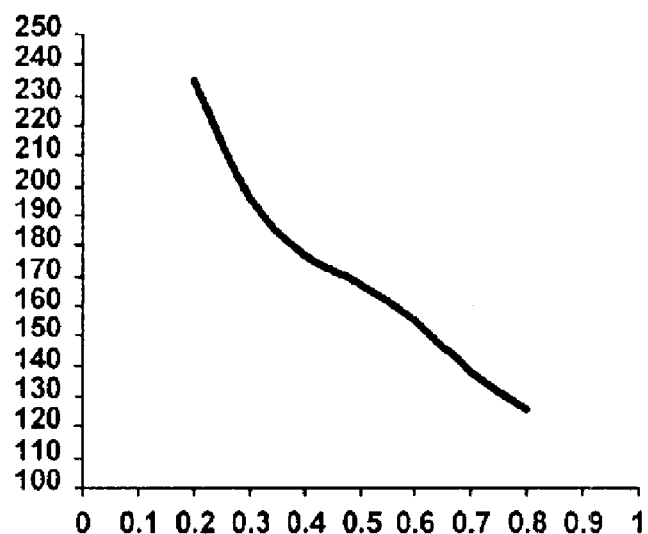
FIG. 23 is a graph showing phase (°) vs. control voltage for the phase shifter of FIG. 22.
Figure 24:
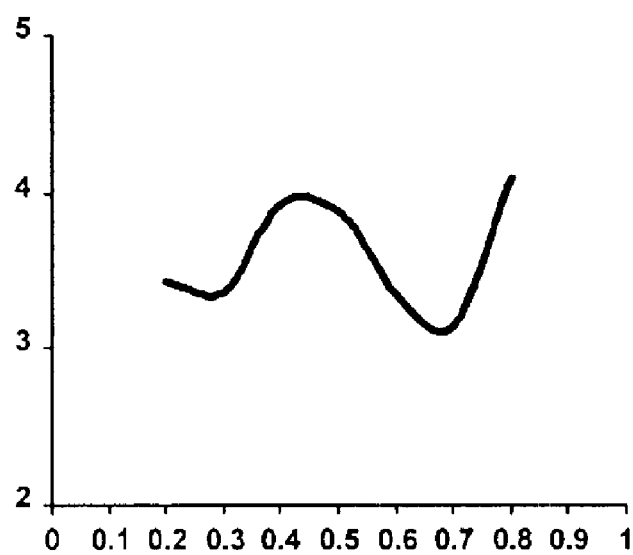
FIG. 24 is a graph showing gain (dB) vs. control voltage for the phase shifter of FIG. 22.

FIG. 23 shows phase (°) of the output signal on RF OUT vs. phase control voltage (i.e., voltage of the phase control signal 16) for the phase shifter of FIG. 22. FIG. 24 shows gain (db) vs. control voltage for the phase shifter of FIG. 22.

Figure 25:
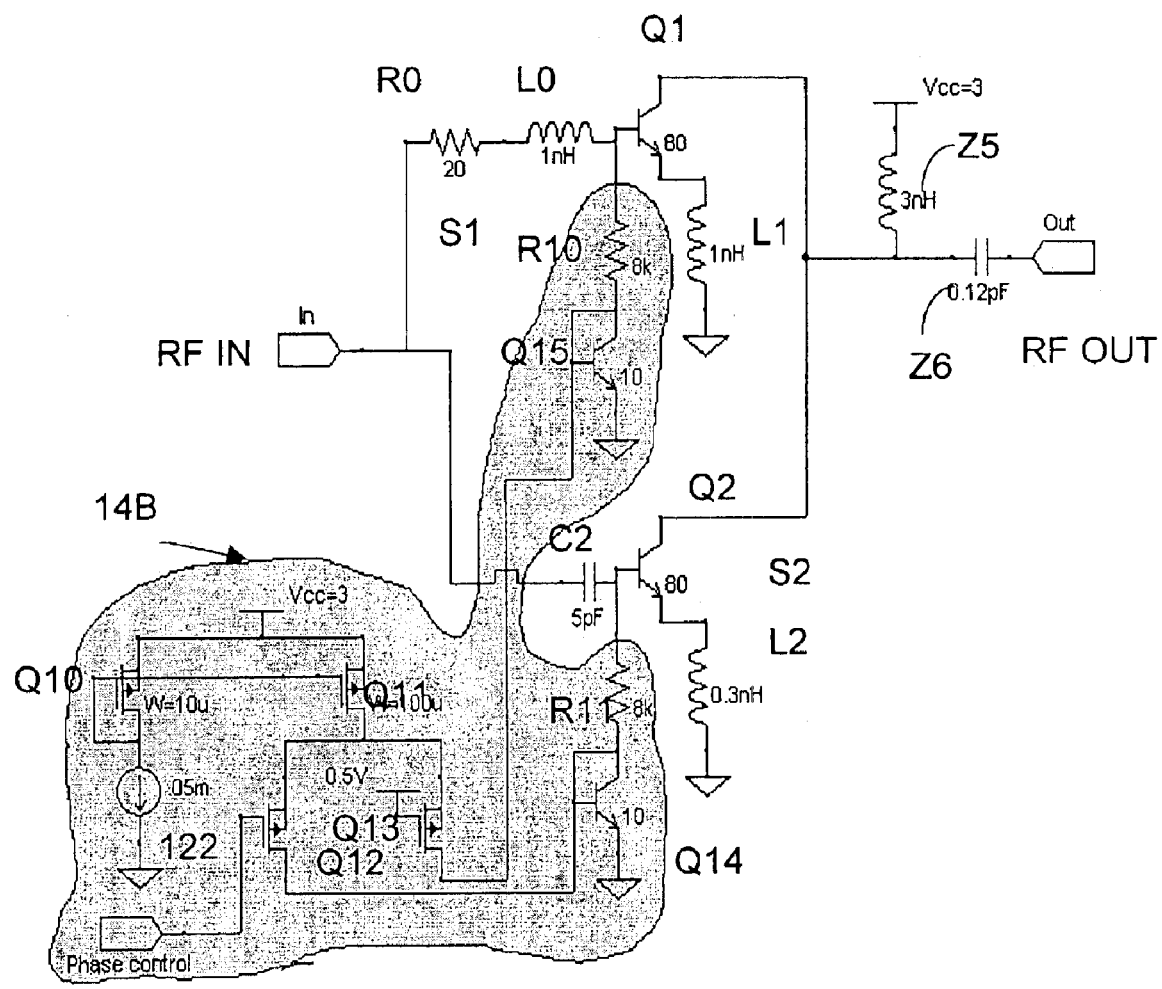
FIG. 25 is a schematic diagram showing a 5 GHz phase shifter of FIG. 2 implemented with bipolar transistor.

FIG. 25 shows a 5 GHz phase shifter 10 implemented with bipolar transistor. The fixed phase shift element S1 of FIG. 25 includes the resistor R0 (20) and the inductors L0 (1 nH) and L1 (1 nH). The fixed phase shift element S2 of FIG. 25 includes the capacitor C2 (5 pF) and the inductor L2 (0.3 nH). The bias controller 14B shown in FIG. 25 includes the current source 122 (0.05 m). Component Z5 (3 nH) and Z6 (0.12 pF) are provided to the output node RF OUT.

Figure 26:
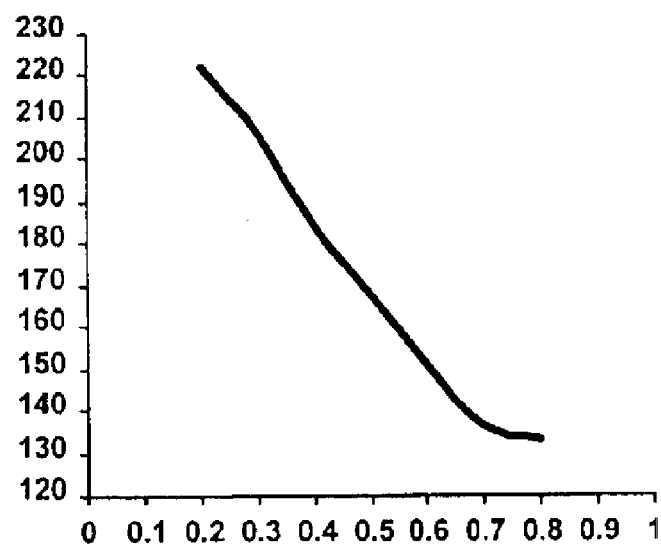
FIG. 26 is a graph showing phase (°) vs. control voltage for the phase shifter of FIG. 25.
Figure 27:
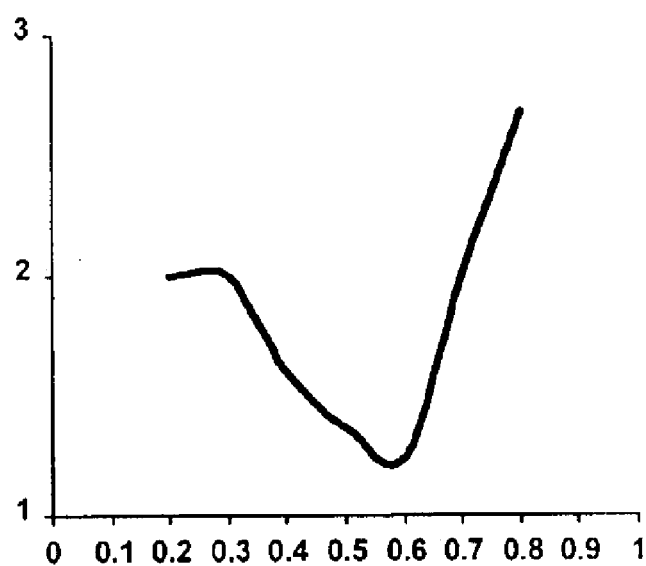
FIG. 27 is a graph showing gain (dB) vs. control voltage for the phase shifter of FIG. 25.

FIG. 26 shows phase (°) of the output signal on RF OUT vs. phase control voltage (i.e., voltage of the phase control signal 16) for the phase shifter of FIG. 25. FIG. 27 shows gain (db) vs. control voltage for the phase shifter of FIG. 25.

Figure 28:
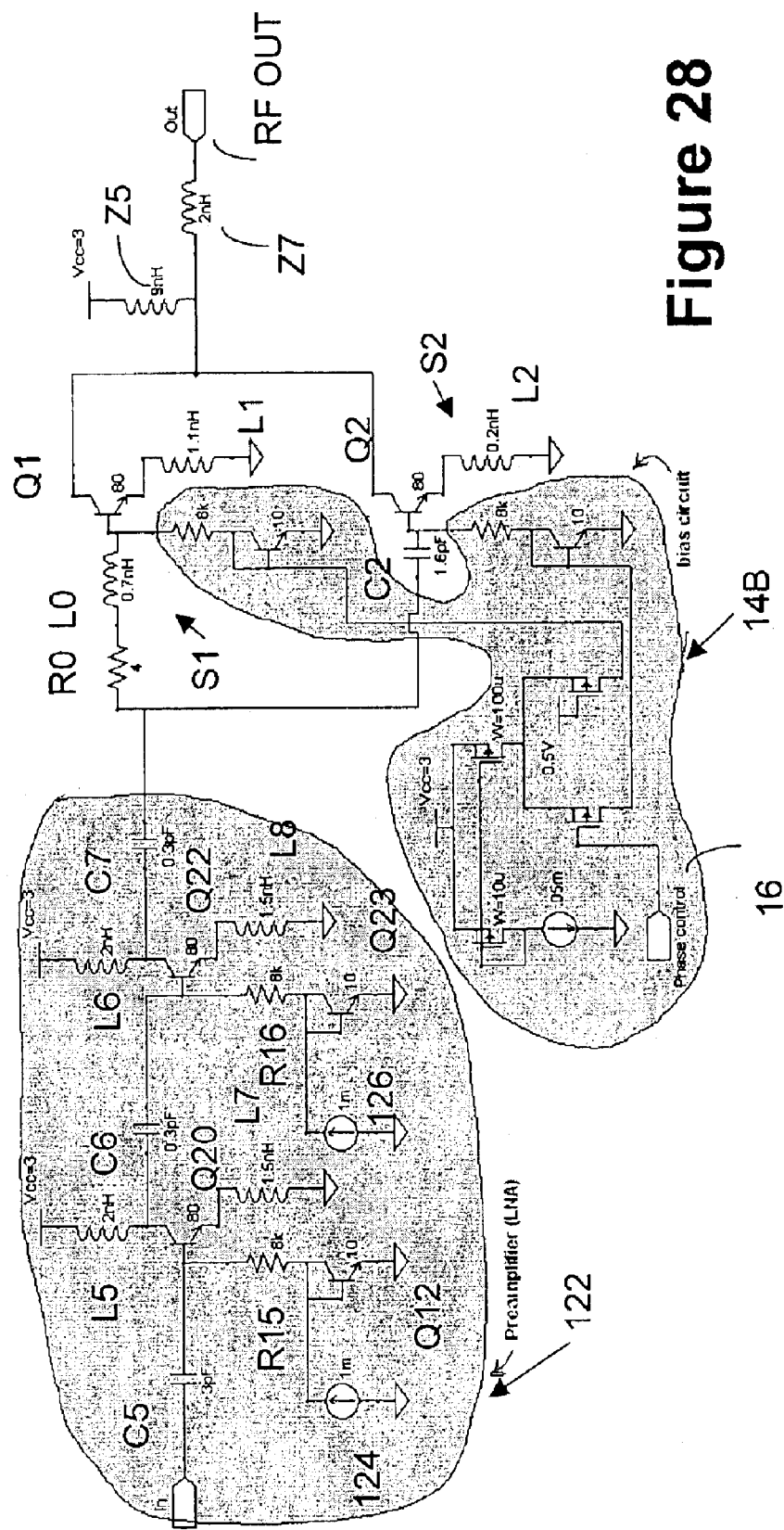
FIG. 28 is a schematic diagram showing a 5 GHz phase shifter of FIG. 2 and an LNA implemented with bipolar transistor.

FIG. 28 shows a 5 GHz phase shifter 10 and an LNA 122 implemented with bipolar transistors. The fixed phase shift element S1 of FIG. 28 includes the resistor R0 (4) and the inductors L0 (0.7 nH) and L1 (1.1 nH). The fixed phase shift element S2 of FIG. 28 includes the capacitor C2 (1.6 pF) and the inductor L2 (0.2 nH). The bias controller 14B shown in FIG. 28 includes the current source 122 (0.05 m). Components Z5 (9 nH) and Z7 (2 nH) are provided to the output node RF OUT.

The LAN 122 is provided between the input node RF IN and the input nodes of the fixed phase shift elements S1 and S2. The LAN 122 includes capacitors C5 (3 pF) and C6–C7 (0.3 pF), resistors R15–R16 (8 k), inductors L5–L6 (2 nH) and L7–L8(1.5 nH), NPN transistors Q20–Q23 and current sources 124–126(1 m). The LAN 122 pre-amplifies an input signal to provide the amplified input signal to the fixed phase shift elements S1 and S2. The component Z5 (9 nH) and Z7(2 nH) are provided to the output node RF OUT.

Figure 29:
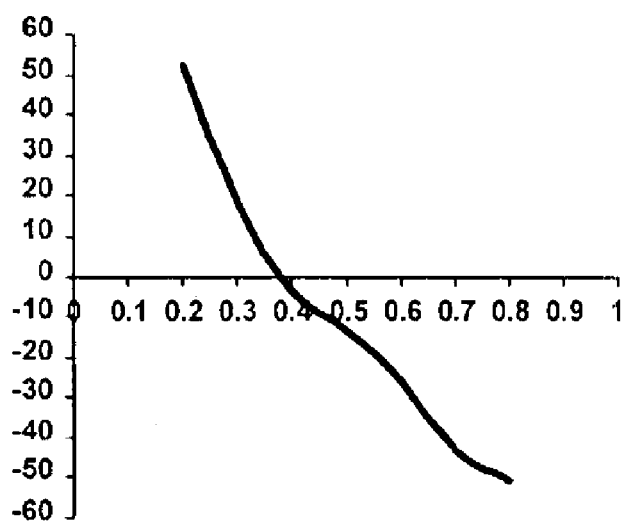
FIG. 29 is a graph showing phase (°) vs. control voltage for the phase shifter of FIG. 28.
Figure 30:
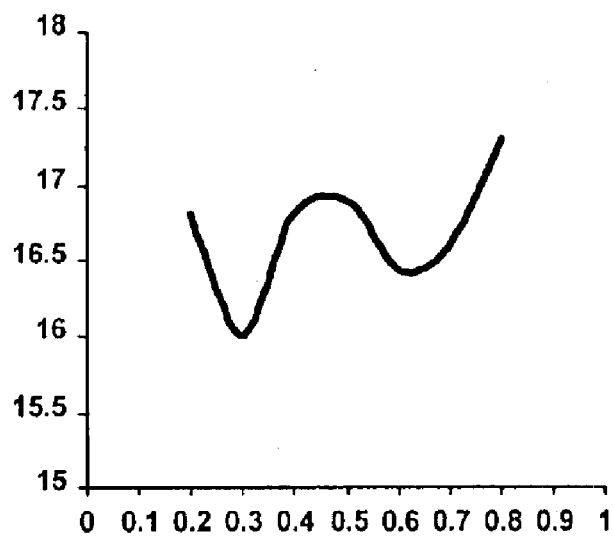
FIG. 30 is a graph showing gain (dB) vs. control voltage for the phase shifter of FIG. 28.

FIG. 29 shows phase (°) of the output signal on RF OUT vs. phase control voltage (i.e., voltage of the phase control signal) for the phase shifter of FIG. 28. FIG. 30 shows gain (dB) vs. control voltage for the phase shifter of FIG. 28.

As shown in FIGS. 23–24, 26–27 and 29–30, the phase shifter 10 increases linearity and stability of phase shifting.

Figure 31:
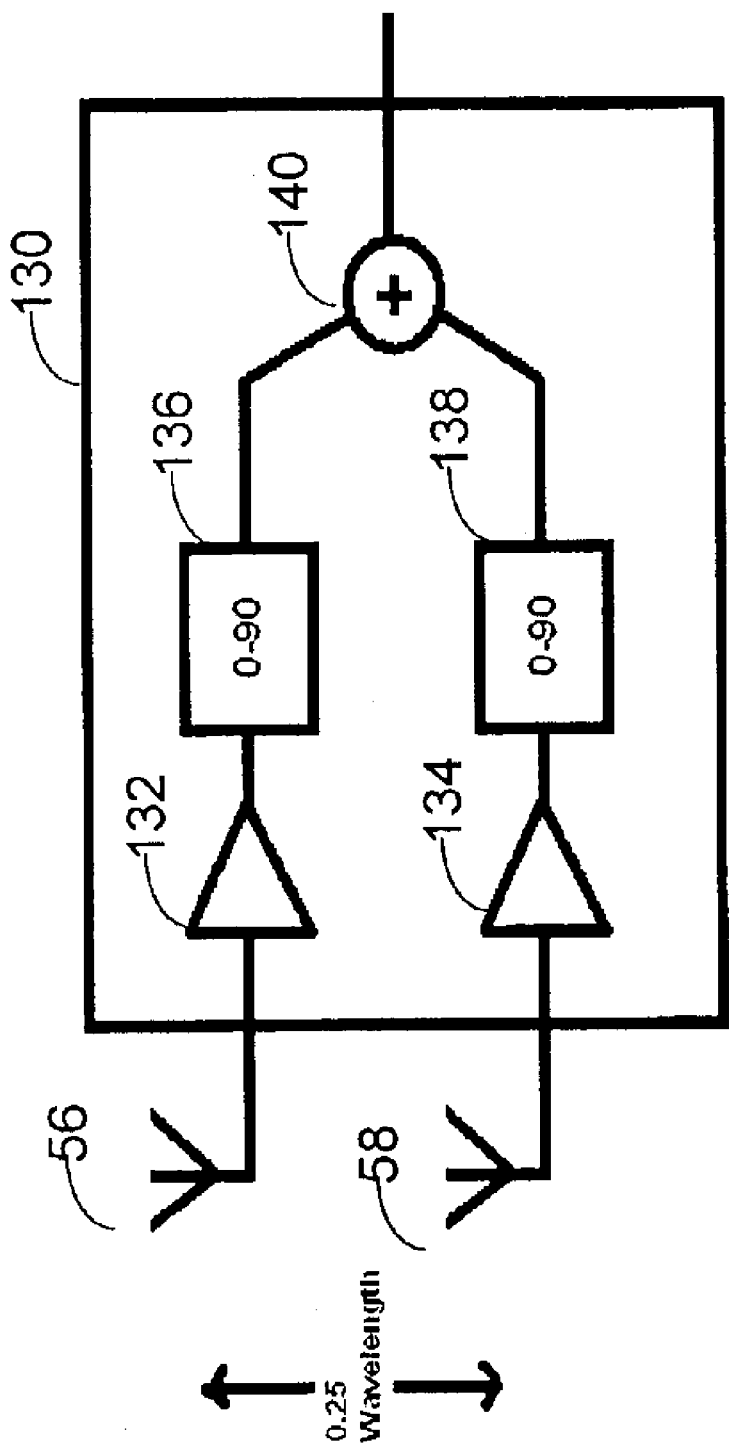
FIG. 31 is a diagram showing a smart antenna front-end system using the phase shifter of FIG. 2.

FIG. 31 shows a further example of a smart antenna front-end system 130 using the phase shifter 10 of FIG. 2. The smart antenna front-end system 130 of FIG. 31 includes the phase shifters 136 and 138 connected to the antennas 56 and 58, phase shifters 136 and 138 and a combiner 140. Each of the phase shifters 136 and 138 performs phase-shifting ranging from 0 to 90°. Each of the phase shifters 136 and 138 is similar to the phase shift 10 shown in FIG. 2. The combiner 140 combines the outputs of the phase shifters 136 and 138. The smart antenna front-end system 130 may include preamplifiers 132 and 134 for pre-amplifying an input signal to provide the amplified signal to the phase shifters 136 and 138.

Figure 32:
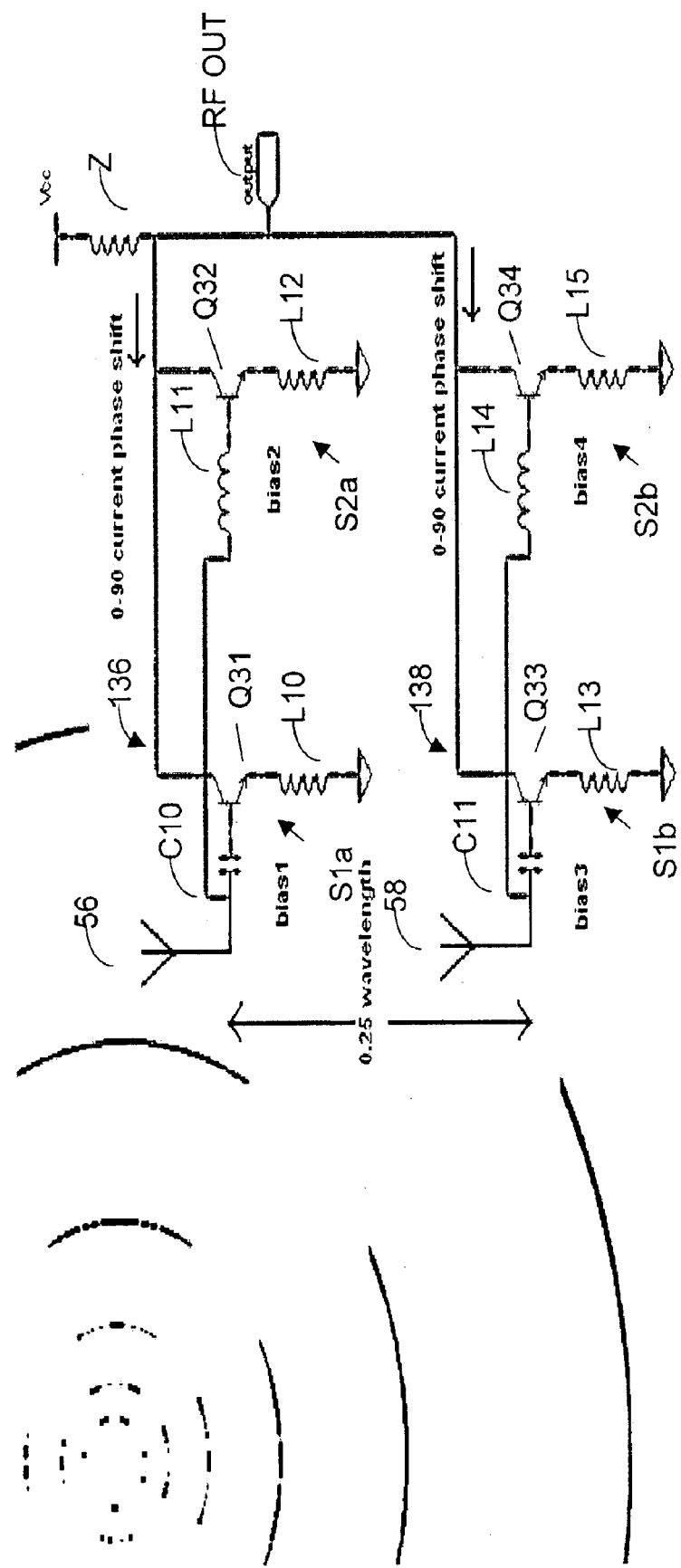
FIG. 32 is a diagram showing an example of the smart antenna front-end system of FIG. 31.

FIG. 32 shows an example of the smart antenna front-end system 130 of FIG. 31. The phase shifter 136 includes the fixed phase shift elements S1a and S1b. The phase shifter 138 includes the fixed phase shift elements S1b and S2b. The component Z may be provided to the output node RF OUT.

The fixed phase shift element S1a has a capacitor C10 and an inductor L10, and is connected to an active device Q31. The fixed phase shift element S2a has inductors L11 and L12, and is connected to an active device Q32. The inductors L10 and L12 are similar to the inductor L1 or L2 of FIG. 3. The active devices Q31 and Q32 may be a NPN or NMOS transistor. The fixed phase shift element S1b has a capacitor C11 and an inductor L13, and is connected to an active device Q33. The fixed phase shift element S2b has inductors L14 and L15, and is connected to an active device Q34. The inductors L13 and L15 are similar to the inductor L1 or L2 of FIG. 3. The active devices Q33 and Q34 may be a NPN or NMOS transistor.

The bias of each active device Q31–Q34 is controlled by the bias controller (i.e. 14 of FIG. 2).

As described in equation (5), range of phase shifter (136 and 138) is 180°:

$$\Delta\varnothing=(0°\rightarrow 90°)-(0°\rightarrow 90°)=90°\rightarrow -90° \quad (5)$$

According to the embodiment of the present invention, the phase shifter 10 uses minimum transistors and amplifiers to improve overall linearity and stability for phase shifting.

Mutiple amplifiers cause nonlinearity. Since the phase shifter 10 does not have a preamplifier for each path, that results in linearity and stability for phase shifting and size reduction.

An on-chip inductor is large and expensive, and creates unwanted EM and substrate coupling especially in silicon. Multiple on-chip inductors require high cost, and cause gain loss and unwanted RF coupling of phase shifting circuit. The phase shifter 10 of FIG. 10 uses one on-chip inductor (L0). That results in low cost and linearity and stability of phase shifting.

According to the embodiment of the present invention, input and output impedances are well matched. That allows gain loss, noise and power consumption to be lower.

Further, the phase shifter 10 is suitably implemented on silicon CMOS/bipolar, since the phase shifter 10 has few inductors, and the input/output matching is performed. The phase shifter 10 can be integrated on a Radio Frequency Integrated Circuit (RFIC). That enables smart antenna on a single chip.

While particular embodiments of the present invention have been shown and described, changes and modifications may be made to such embodiments without departing from the true scope of the invention.

What is claimed is:

1. A variable phase shifter comprising:
    an input node for receiving an input signal;
    a first path and a second path for performing analog signal processing;
    an output node for combining the outputs of the first path and the second path to provide an output signal;
    the first path including a first fixed phase shift element for shifting the phase of the input signal by a first shift value, a first active device for amplifying the output of the first phase shift element, and a first inductor for balancing gain and phase, the first active device being inductively coupled to a ground via the first inductor;
    the second path including a second fixed phase shift element for shifting the phase of the input signal by a second shift value, a second active device for amplifying the output of the second phase shift element, and a second inductor for balancing gain and phase, the second active device being inductively coupled to a ground via the second inductor; and
    a bias controller for generating first and second bias signals in response to a phase control signal for controlling amplification of the first and second active devices.

2. The variable phase shifter according to claim 1 wherein the first active device has a first transistor and the second active device has a second transistor, the first inductor being coupled between one node of the first transistor and a ground node, the second inductor being coupled between one node of the second transistor and a ground node.

3. The variable phase shifter according to claim 2, wherein the first fixed phase shift element acts as a sine component and the second fixed phase shift element acts as a cosine component, the outputs of the first and second fixed phase shift elements being expressed by an equation (1), $$A_1 \text{Sin}(\omega t) + A_2 \text{Cos}(\omega t) = \sqrt{A_1^2 + A_2^2} \times \text{Sin}\left(\omega t + \tan^{-1}\left(\frac{A_2}{A_1}\right)\right) \quad (1)$$

where $\omega$ represents a frequency of the input signal, and $A_1$ and $A_2$ meet equations (2)–(3), $$A_1 \propto \frac{I_c(Q_1)}{L_1} \quad (2)$$

$$A_2 \propto \frac{I_c(Q_2)}{L_2} \quad (3)$$

where $I_c(Q_1)$ represents Idc current of the first transistor, $I_c(Q_2)$ represents Idc current of the second transistor, $L_1$ is an inductance of the first inductor, $L_2$ is an inductance of the second inductor, wherein the bias controller controls the first and second bias signals to adjust $A_1$ and $A_2$.

4. The variable phase shifter according to claim 2 wherein the first and second transistors are Field Effect Transistors (FETs), the output of the first fixed phase shift element and the first bias signal being connected to the gate node of the corresponding FET, the output of the second fixed phase shift element and the second gate signal being connected to the gate node of the corresponding FET, the drain nodes of the FETs being connected to the output node.

5. The variable phase shifter according to claim 2 wherein the first and second transistors are Bipolar Transistors, the output of the first fixed phase shift element and the first bias signal being connected to the base node of the corresponding Bipolar Transistor, the output of the second fixed phase shift element and the second bias signal being connected to the base node of the corresponding Bipolar Transistor, the collectors of the Bipolar Transistors being connected to the output node.

6. The variable phase shifter according to claim 2 wherein the first fixed phase shift element includes a further inductor, the active node of the first transistor being connected to the first bias signal and the inductor, the second fixed phase shift element including a capacitor, the active node of the second transistor being connected to the second bias signal and the capacitor.

7. The variable phase shifter according to claim 6, wherein the first and second inductors are fabricated by bondwire, and the further inductor is an on-chip inductor.

8. The variable phase shifter according to claim 2, further comprising a capacitor which connects the input node to the inputs of the first and second fixed phase shift elements.

9. The variable phase shifter according to claim 2, wherein the first and second inductors are fabricated by bondwire.

10. The variable phase shifter according to claim 1 wherein the bias controller includes a current mirror circuit.

11. The variable phase shifter according to claim 1 wherein the first and second fixed phase shift elements are LC ladders.

12. The variable phase shifter according to claim 1, further comprising an amplifier to compensate gain variation of the phase shifter.

13. The variable phase shifter according to claim 1, wherein the bias controller changes, based on a total bias of the phase shifter, the first and second bias signals without changing their ratio to compensate the total bias of the phase shifter.

14. The variable phase shifter according to claim 1, further comprising a component for performing impedance matching.

15. A smart antenna front end system comprising:
    a receiver for receiving an RF receiving signal from an antenna, the receiver including first and second variable phase shifter;
    a transmitter for transmitting an RF transmitting signal from the antenna, the transmitter including third and forth variable phase shifter;

each of the first, second, third and forth variable phase shifter including:

an input node for receiving an input signal;

a first path and a second path for performing analog signal processing;

an output node for combining the outputs of the first path and the second path to provide an output signal;

the first path including a first fixed phase shift element for shifting the phase of the input signal by a first shift value, a first active device for amplifying the output of the first phase shift element, and a first inductor for balancing gain and phase, the first active device being inductively coupled to a ground via the first inductor;

the second path including a second fixed phase shift element for shifting the phase of the input signal by a second shift value, a second active device for amplifying the output of the second phase shift element, and a second inductor for balancing gain and phase, the second active device being inductively coupled to a ground via the second inductor; and a bias controller for generating first and second bias signals in response to a phase control signal for controlling amplification of the first and second active devices.

16. The smart antenna front end system according to claim 15, wherein the first active device has a first transistor and the second active device has a second transistor, the first inductor being coupled between one node of the first transistor and a ground node, the second inductor being coupled between one node of the second transistor and a ground node.

17. A smart antenna front end system comprising:

a local oscillator path including an local oscillator, and first and second variable phase shifter for shifting the phase of an input signal output from the local oscillator;

a receiver for receiving an RF receiving signal from an antenna, the receiver including a first mixer for mixing the RF receiving signal and the output of the first variable phase shifter, and a second mixer for mixing the RF receiving signal and the output of the second variable phase shifter;

a transmitter for transmitting an RF transmitting signal from the antenna, the transmitter including a third mixer for mixing an IF signal and the output of the first variable phase shifter, and a fourth mixer for mixing the IF signal and the output of the second variable phase shifter;

each of the first and second variable phase shifter including:

an input node for receiving an input signal;

a first path and a second path for performing analog signal processing;

an output node for combining the outputs of the first path and the second path to provide an output signal;

the first path including a first fixed phase shift element for shifting the phase of the input signal by a first shift value, and a first active device for amplifying the output of the first phase shift element, the firm active device being inductively coupled to a ground via a first element of the first fixed phase shift element;

the second path including a second fixed phase shift element for shifting the phase of the input signal by a second shift value, and a second active device for amplifying the output of the second phase shift element, the second active device being inductively coupled to a ground via a second element of the second fixed phase shift element; and a bias controller for generating first and second bias signals in response to a phase control signal for controlling amplification of the first and second active devices.

18. The smart antenna front end system according to claim 17, wherein the first active device has a first transistor and the second active device has a second transistor, the first element being an inductor which is coupled between one node of the first transistor and a ground node, the second element being an inductor which is coupled between one node of the second transistor and a ground node.

19. A differential phase shifter comprising:

first and second variable phase shifters for receiving input signals, each of the input signals being similar in amplitude and 180° out of phase;

each of the first and second variable phase shifters including:

an input node for receiving the corresponding input signal;

a first path and a second path for performing analog signal processing, an output node for combining the outputs of the first path and the second path to provide an output signal;

the first path including a first fixed phase shift element for shifting the phase of the input signal by a first shift value, a first active device for amplifying the output of the first phase shift element, and a first inductor for balancing gain and phase, the first active device being inductively coupled to a ground via the first inductor;

the second path including a second fixed phase shift element for shifting the phase of the input signal by a second shift value, a second active device for amplifying the output of the second phase shift element, and a second inductor for balancing gain and phase, the second active device being inductively coupled to a ground via the second inductor; and a bias controller for generating first and second bias signals in response to a phase control signal for controlling amplification of the first and second active devices.

* * * * *